(12) United States Patent
Lee et al.

(10) Patent No.: US 9,153,559 B2
(45) Date of Patent: Oct. 6, 2015

(54) SEMICONDUCTOR DEVICES INCLUDING THROUGH SILICON VIA ELECTRODES AND METHODS OF FABRICATING THE SAME

(75) Inventors: Dosun Lee, Gwangju (KR); Byung Lyul Park, Seoul (KR); Gilheyun Choi, Seoul (KR); Kwangjin Moon, Hwaseong-si (KR); Kunsang Park, Hwaseong-si (KR); Sukchul Bang, Yongin-si (KR); Seongmin Son, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/610,296

(22) Filed: Sep. 11, 2012

(65) Prior Publication Data

US 2013/0127019 A1 May 23, 2013

(30) Foreign Application Priority Data

Nov. 18, 2011 (KR) ........................ 10-2011-0121048

(51) Int. Cl.
*H01L 29/40* (2006.01)
*H01L 25/065* (2006.01)
*H01L 23/31* (2006.01)
*H01L 23/48* (2006.01)
*H01L 21/768* (2006.01)
*H01L 23/498* (2006.01)

(52) U.S. Cl.
CPC ...... *H01L 25/0657* (2013.01); *H01L 21/76898* (2013.01); *H01L 23/3128* (2013.01); *H01L 23/481* (2013.01); *H01L 21/7682* (2013.01); *H01L 23/49827* (2013.01); *H01L 2224/16225* (2013.01); *H01L 2225/06513* (2013.01); *H01L 2225/06544* (2013.01); *H01L 2924/15311* (2013.01)

(58) Field of Classification Search
CPC .................................................. H01L 21/76898
USPC .......................................... 257/621, E23.141
See application file for complete search history.

(56) References Cited

U.S. PATENT DOCUMENTS

| 7,564,118 B2 | 7/2009 | Pogge et al. | |
|---|---|---|---|
| 2005/0121768 A1* | 6/2005 | Edelstein et al. | 257/698 |
| 2007/0167004 A1* | 7/2007 | Trezza | 438/667 |
| 2012/0112361 A1* | 5/2012 | Han et al. | 257/774 |

FOREIGN PATENT DOCUMENTS

| JP | 2009-272490 | 11/2009 |
|---|---|---|
| JP | 2010-135348 | 6/2010 |

OTHER PUBLICATIONS

Lu et al. "Thermo-Mechanical Reliability of 3-D ICs Containing Through Silicon Vias" IEEE, Electronics Components and Technology Conference, pp. 630-634, 2009.

* cited by examiner

*Primary Examiner* — Hsin-Yi Hsieh
(74) *Attorney, Agent, or Firm* — Myers Bigel Sibley & Sajovec, P.A.

(57) ABSTRACT

A semiconductor device may include a semiconductor substrate, a through via electrode, and a buffer. The through via electrode may extend through a thickness of the semiconductor substrate with the through via electrode surrounding an inner portion of the semiconductor substrate so that the inner portion of the semiconductor substrate may thus be isolated from the outer portion of the semiconductor substrate. The buffer may be in the inner portion of the semiconductor substrate with the through via electrode surrounding and spaced apart from the buffer. Related methods are also discussed.

19 Claims, 21 Drawing Sheets

SEMICONDUCTOR DEVICES INCLUDING THROUGH SILICON VIA ELECTRODES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0121048, filed on Nov. 18, 2011, in the Korean Intellectual Property Office, the entire disclosure of which is hereby incorporated by reference herein.

BACKGROUND

1. Technical Field

The present disclosure herein relates to semiconductor devices and methods of fabricating the same and, more particularly, to semiconductor devices having through silicon via (TSV) electrodes and methods of fabricating the same.

2. Description of Related Art

In the electronics industry, low cost electronic devices have been increasingly demanded with the development of lighter, smaller, faster, more multi-functional, and/or higher performance electronic systems. In response to such demand, multi-chip stacked package techniques and/or systems in package techniques may be used.

In a multi-chip stacked package or system in package, one or more functions of a plurality of semiconductor devices may be performed in a single semiconductor package. A multi-chip stacked package or system in package may have a size similar to a single chip package in terms of a planar surface area or 'footprint'. Thus, a multi-chip stacked package or system in package may be used in small and/or mobile devices with high performance requirements, such as, mobile phones, notebook computers, memory cards, and/or portable camcorders.

Multi-chip stacked package techniques or system in package techniques may be realized using through silicon via (TSV) electrodes. However, the use of TSV electrodes may be associated with problems, which may affect performance of the devices in which they are used.

SUMMARY

Examples of embodiments of inventive concepts are directed to semiconductor devices and methods of forming the same.

According to some embodiments, a semiconductor device may include a substrate, and a buffer portion in the substrate. A through via electrode may surround the buffer portion and may penetrate the substrate to be spaced apart from the buffer portion. An isolated substrate portion may be provided between the buffer portion and the through via electrode.

The buffer portion may include at least one of an air gap and/or a seam. The semiconductor device may further include a buffer insulation layer or a buffer conductive layer that is disposed between the buffer portion and the isolated substrate portion to define the buffer portion. Moreover, the semiconductor device may further include an insulation liner, a diffusion barrier layer and a seed layer that are disposed between the through via electrode and the substrate. The buffer insulation layer may include a same material as the insulation liner, and the buffer conductive layer may include a same material as the diffusion barrier layer, the seed layer and the through via electrode.

A bottom surface of the buffer portion may be located at a higher level than a bottom surface of the through via electrode, and the isolated substrate portion may have a cup-shaped structure.

A bottom surface of the buffer portion may be located at a same level as a bottom surface of the through via electrode, and the isolated substrate portion may have a pipe-shaped structure surrounding the buffer portion.

The buffer portion may include a first buffer portion and at least one second buffer portion surrounding the first buffer portion.

The buffer portion may be disposed in an inner hole or an inner trench formed in the isolated substrate portion, and the through via electrode may be disposed in an outer trench surrounding the inner hole or the inner trench. Further, a diameter of the inner hole or a width of the inner trench may be less than half of a difference between an inner diameter and an outer diameter of the outer trench.

The isolated substrate portion may include a same material as the substrate.

According to further embodiments, a method of fabricating a semiconductor device may include forming an inner hole or an inner trench in a substrate, and etching the substrate to form an annular outer trench surrounding and spaced apart from the inner hole or the inner trench. A buffer portion may be formed in the inner hole or the inner trench, and a through via electrode may be formed in the annular outer trench.

A diameter of the inner hole may be less than half of a difference between an outer diameter and an inner diameter of the annular outer trench, and a depth of the inner hole may be less than a depth of the annular outer trench.

The method may further include removing a lower portion of the substrate to expose a bottom surface of the through via electrode.

The method may further include removing a lower portion of the substrate to expose bottom surfaces of the through via electrode and the buffer portion.

Forming the buffer portion in the inner hole or the inner trench may include forming an insulation layer or a conductive layer on the substrate having the outer trench such that the insulation layer or the conductive layer conformally covers an inner surface of the outer trench and simultaneously closes at least an inlet of the inner hole or the inner trench. The insulation layer or the conductive layer may provide an air gap or a seam in the inner hole or the inner trench.

Forming the inner hole or the inner trench and forming the outer trench may be simultaneously performed.

According to still further embodiments a semiconductor device may include a semiconductor substrate, a through via electrode, and a buffer. The through via electrode may extend through a thickness of the semiconductor substrate with the through via electrode surrounding an inner portion of the semiconductor substrate so that the inner portion of the semiconductor substrate is isolated from the outer portion of the semiconductor substrate. The buffer may be in the inner portion of the semiconductor substrate with the through via electrode surrounding and spaced apart from the buffer.

The buffer may include a hole and/or a trench within the inner portion of the semiconductor substrate. The buffer may define a gap within the inner portion of the semiconductor substrate, with the gap being free of any solid material. The buffer may include an electrically insulating material and/or an electrically conducting material within the inner portion of the semiconductor substrate. Moreover, a depth of the buffer into the inner portion of the semiconductor substrate may be less than a thickness of the semiconductor substrate.

BRIEF DESCRIPTION OF THE DRAWINGS

Inventive concepts will become more apparent in view of the attached drawings and accompanying detailed descriptions.

FIG, 11 is a cross sectional view illustrating a semiconductor device according to fourth embodiments.

Figure 12:
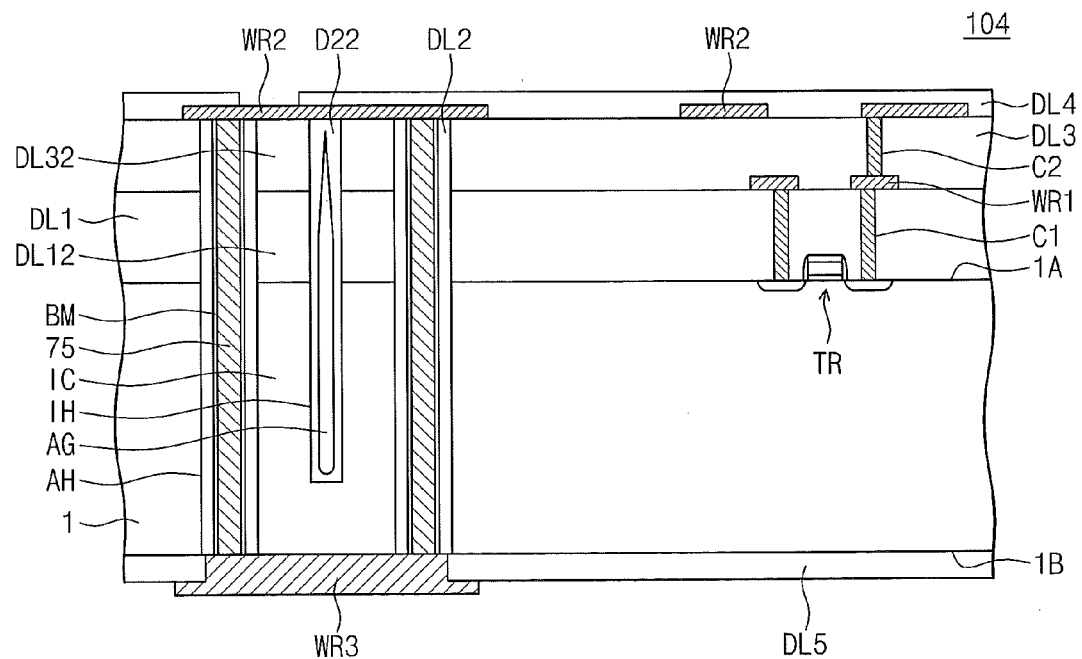

FIG. 12 is a cross sectional view illustrating a semiconductor device according to fifth embodiments.

Figure 13:
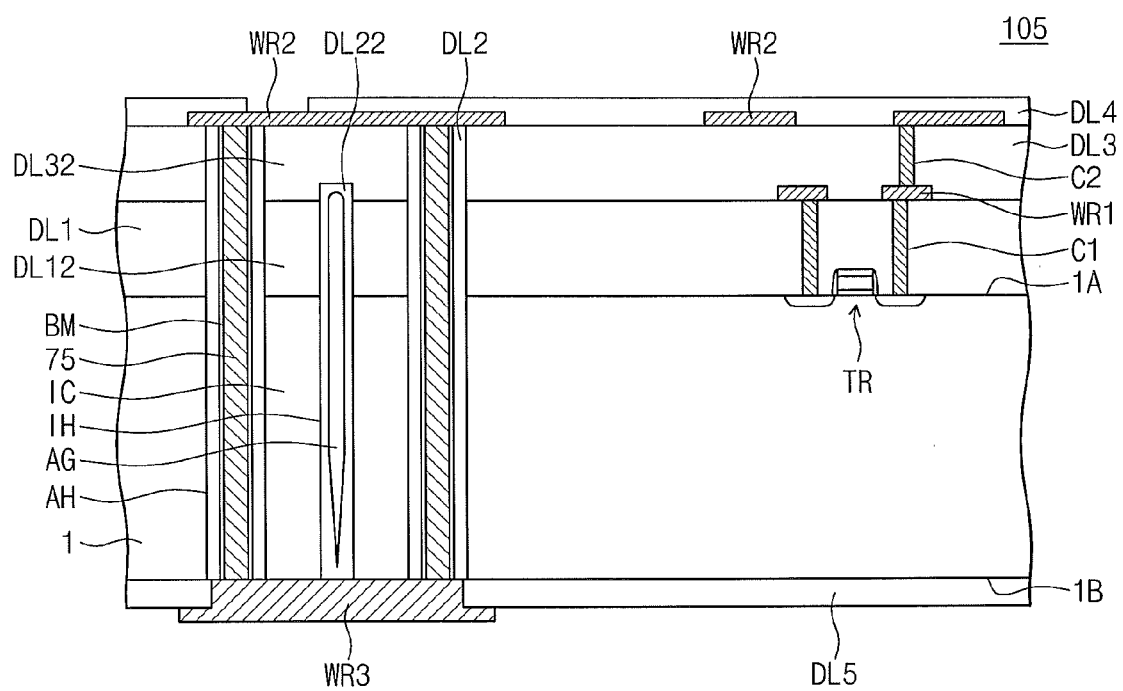

FIG. 13 is a cross sectional view illustrating a semiconductor device according to sixth embodiments.

Figure 14A:
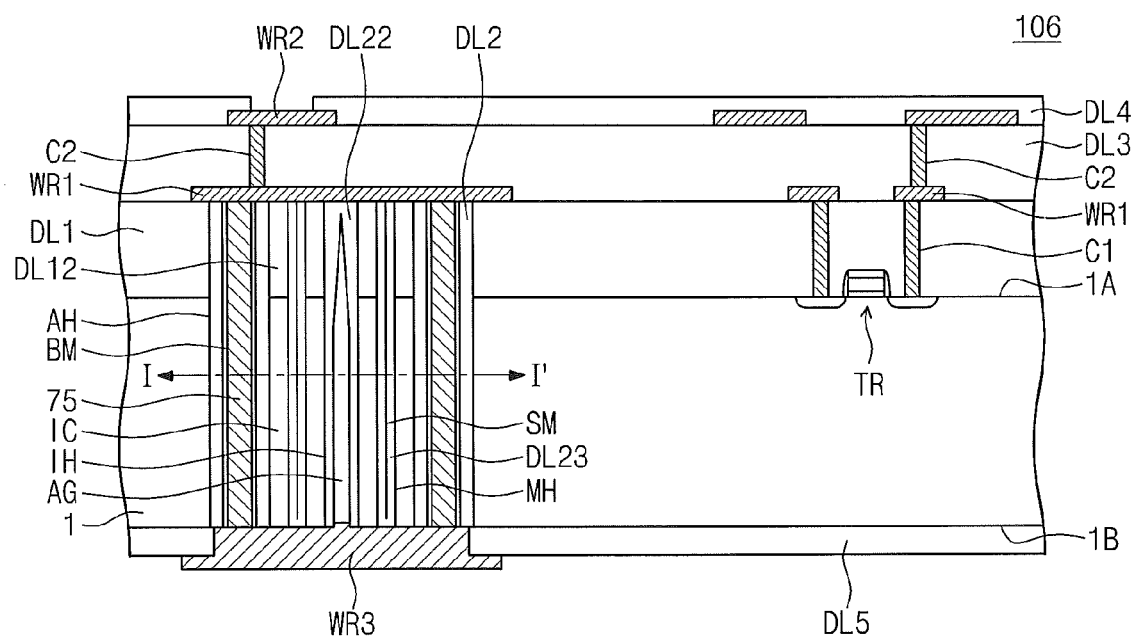

FIG. 14A is a cross sectional view illustrating a semiconductor device according to seventh embodiments.

Figure 14B:
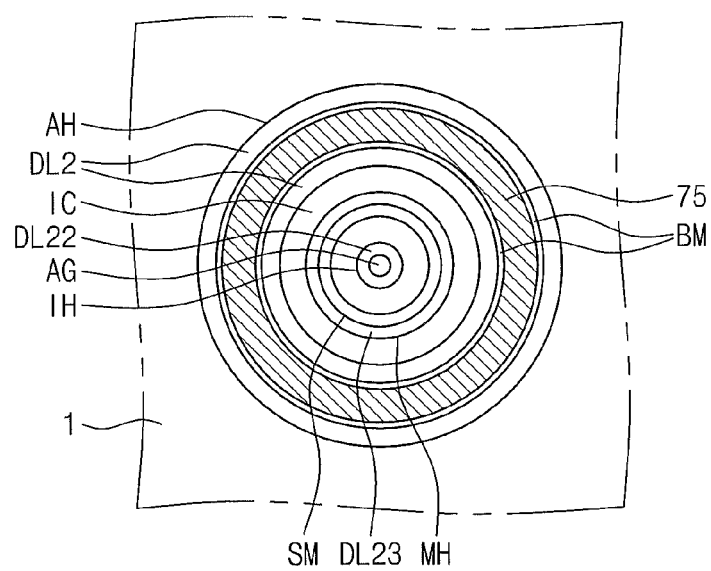

FIG. 14B is a plan view taken along a line I-I' of FIG. 14A.

Figure 15A:
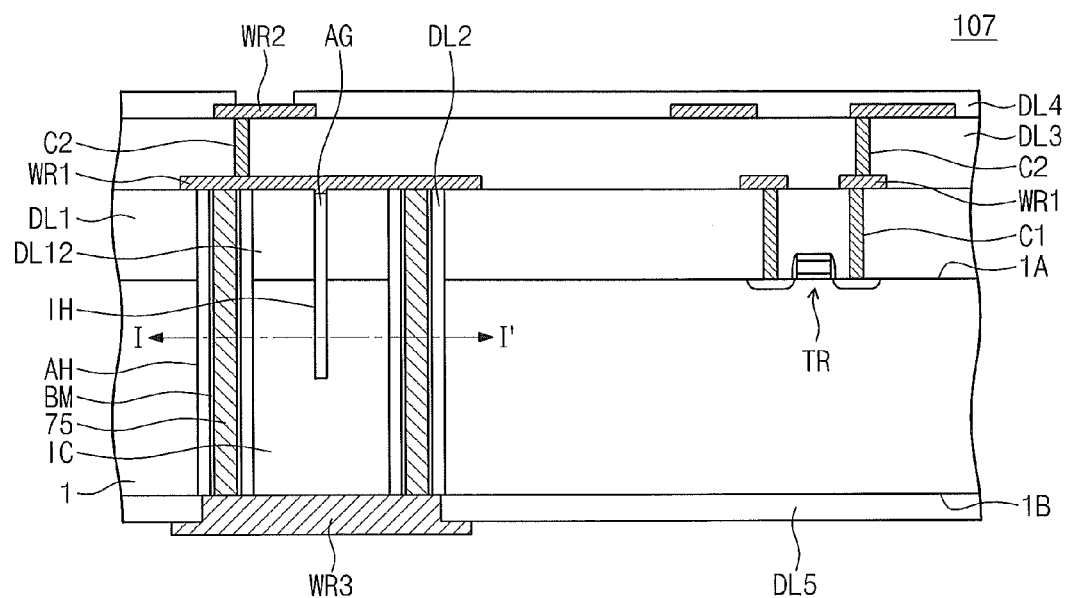

FIG. 15A is a cross sectional view illustrating a semiconductor device according to eighth embodiments.

Figure 15B:
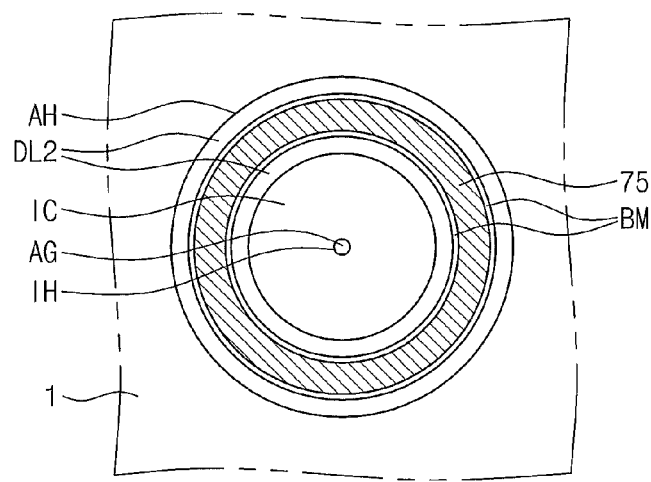

FIG. 15B is a plan view taken along a line I-I' of FIG, 15A.

Figure 16A:
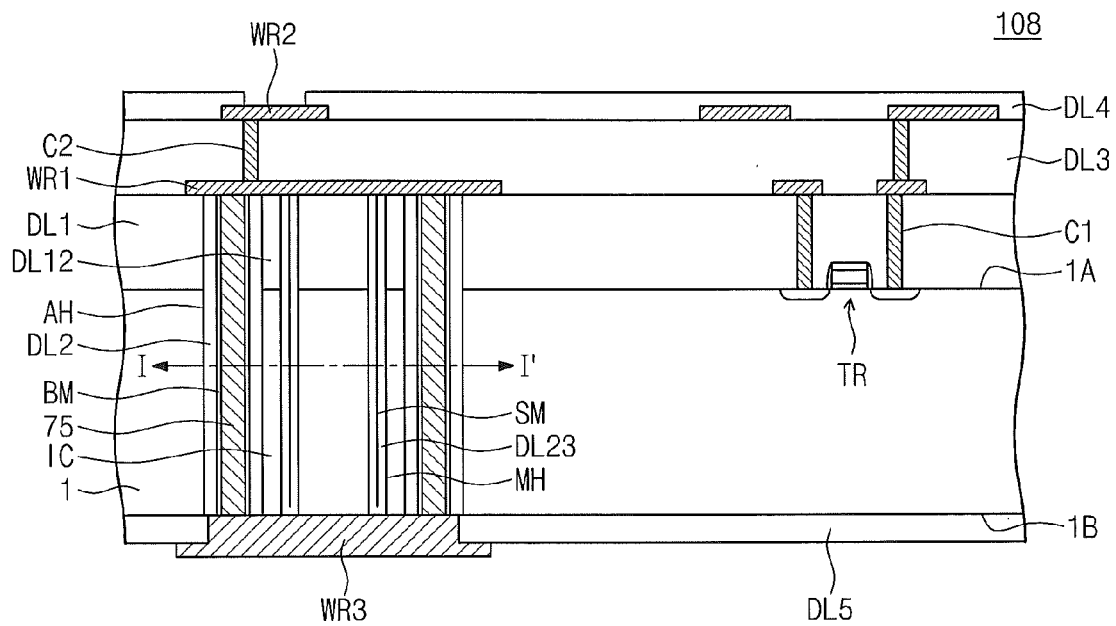

FIG. 16A is a cross sectional view illustrating a semiconductor device according to ninth embodiments.

Figure 16B:
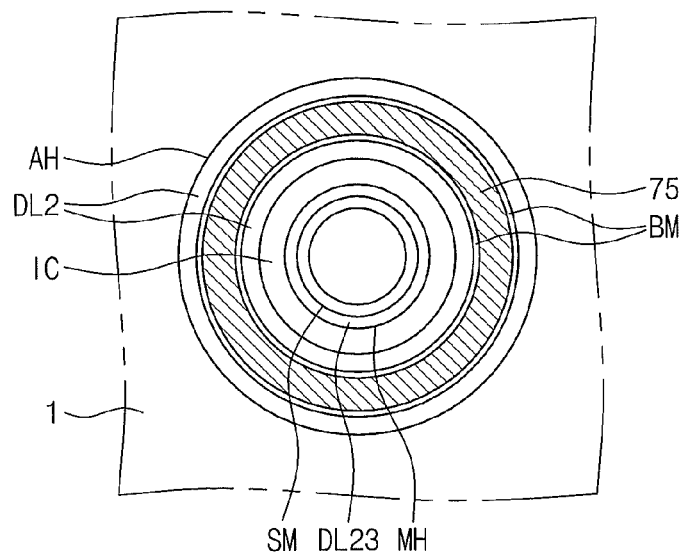

FIG. 16B is a plan view taken along a line I-I' of FIG. 16A.

Figure 17A:
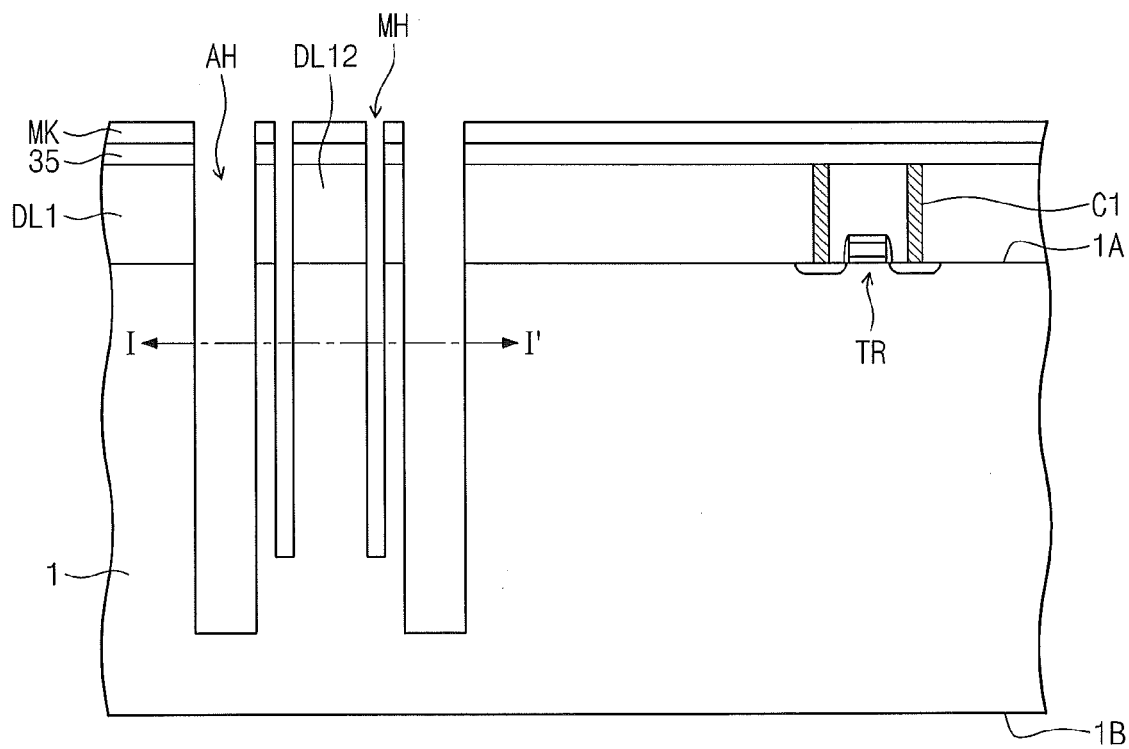

FIG. 17A is a cross sectional view illustrating processes for forming a semiconductor device shown in FIG. 16A.

Figure 17B:
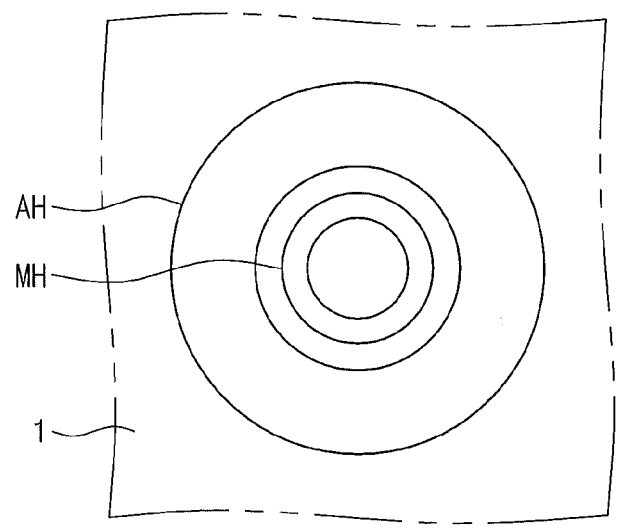

FIG. 17B is a plan view taken along a line I-I' of FIG. 17A.

Figure 18A:
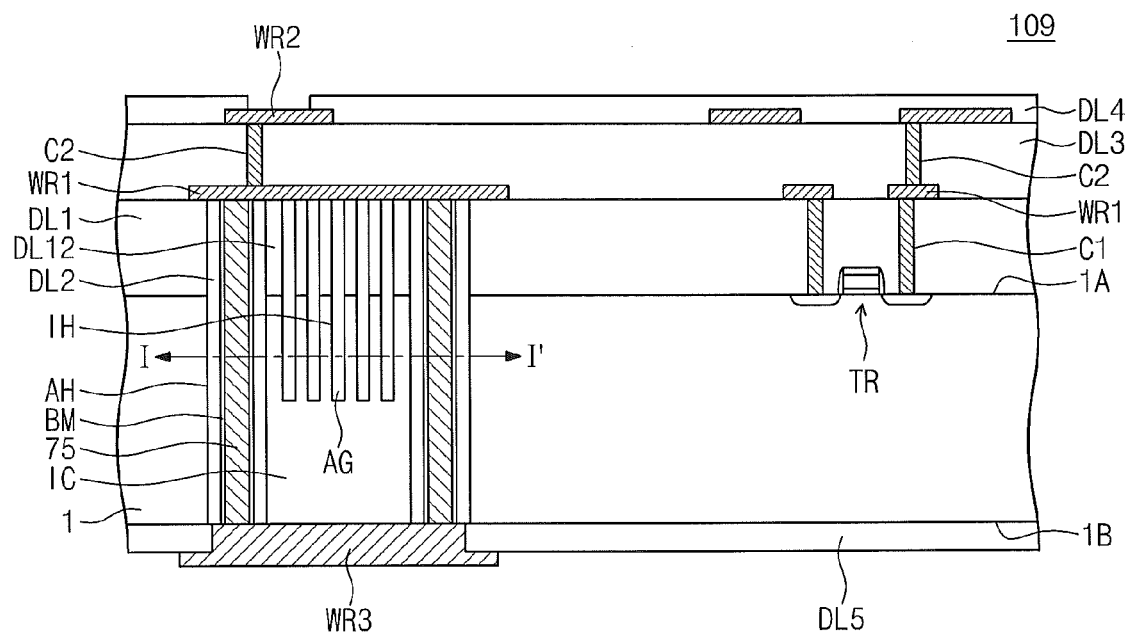

FIG. 18A is a cross sectional view illustrating a semiconductor device according to tenth embodiments.

Figure 18B:
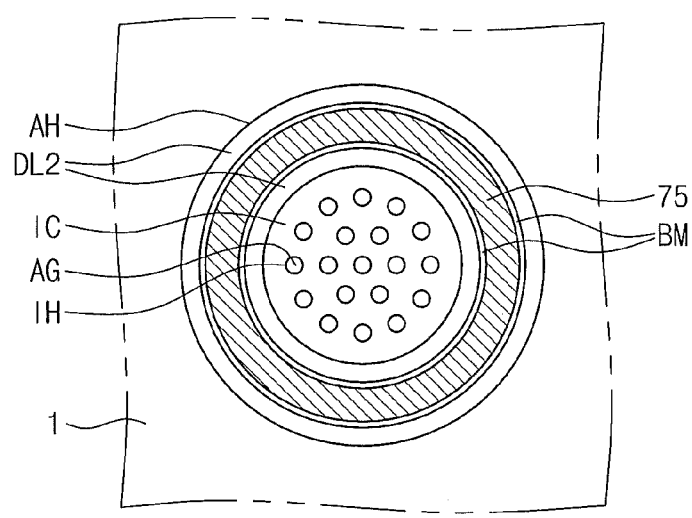

FIG. 18B is a plan view taken along a line I-I' of FIG. 18A.

Figure 19:
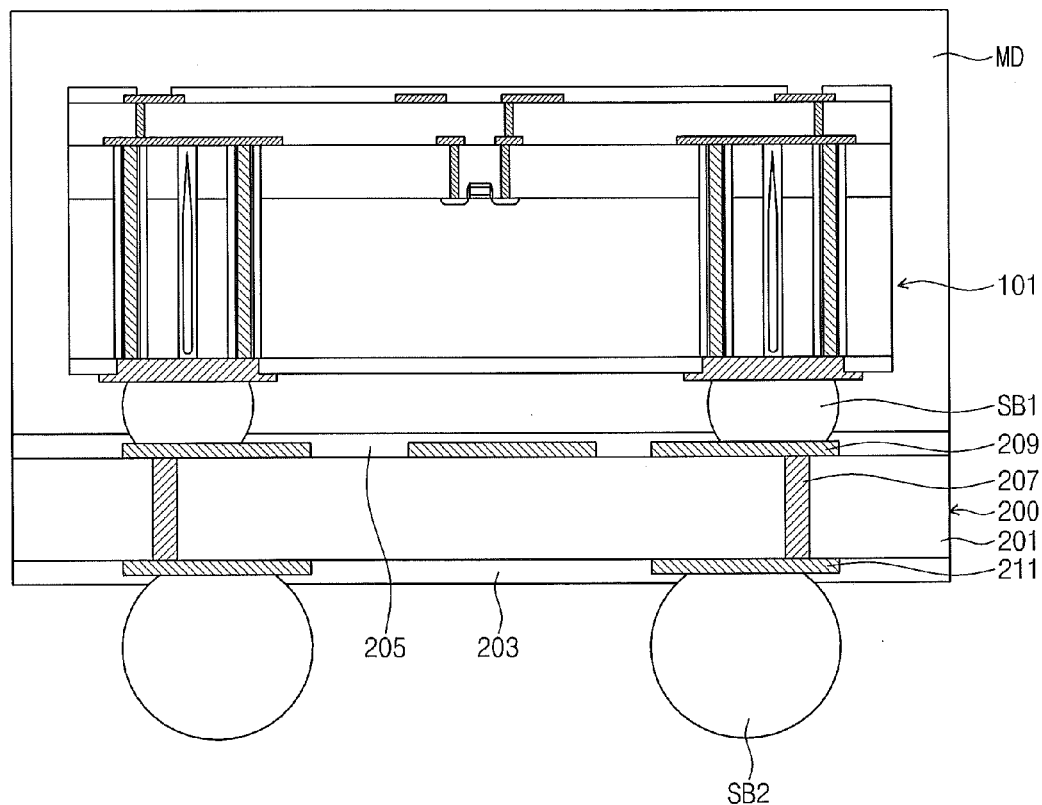
Figure 20:
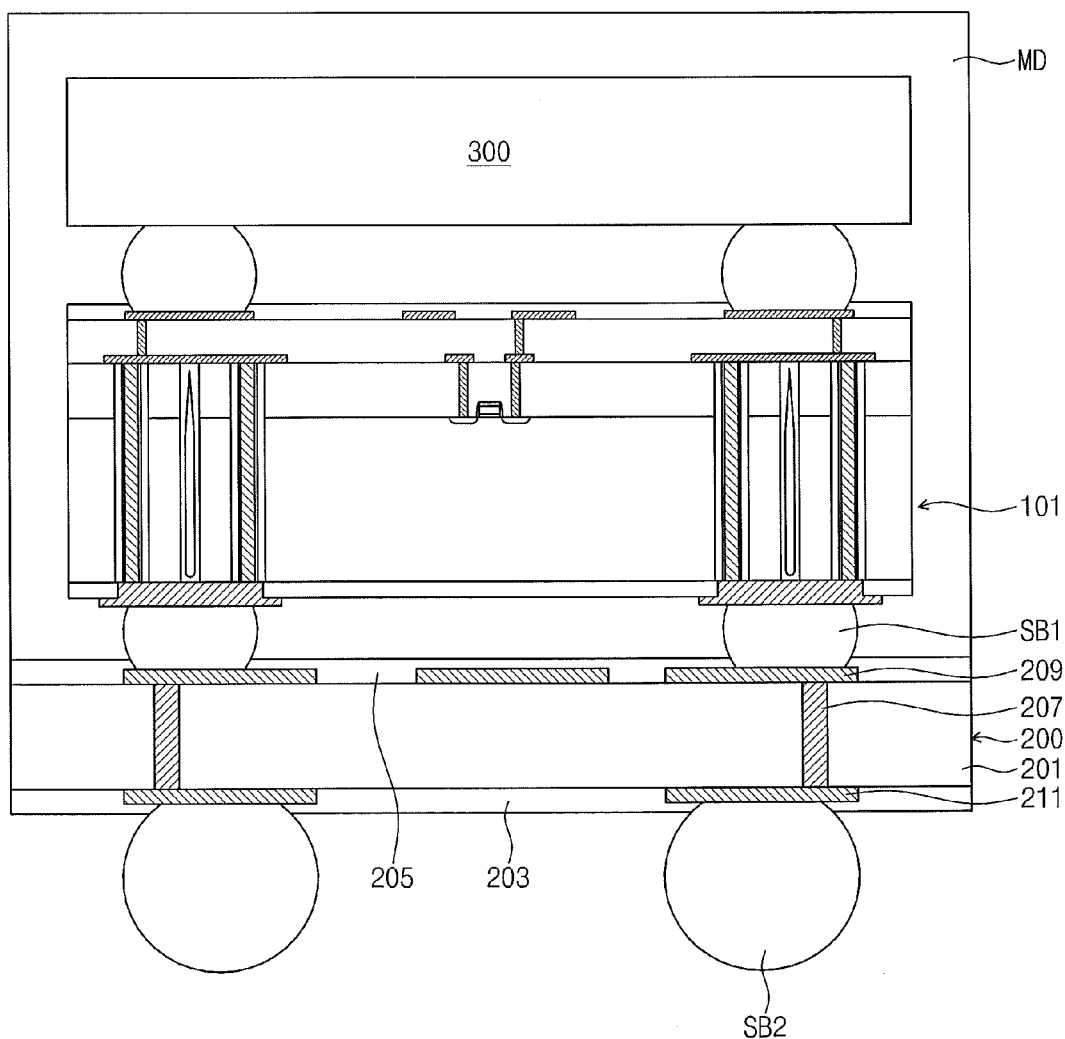
Figure 21:
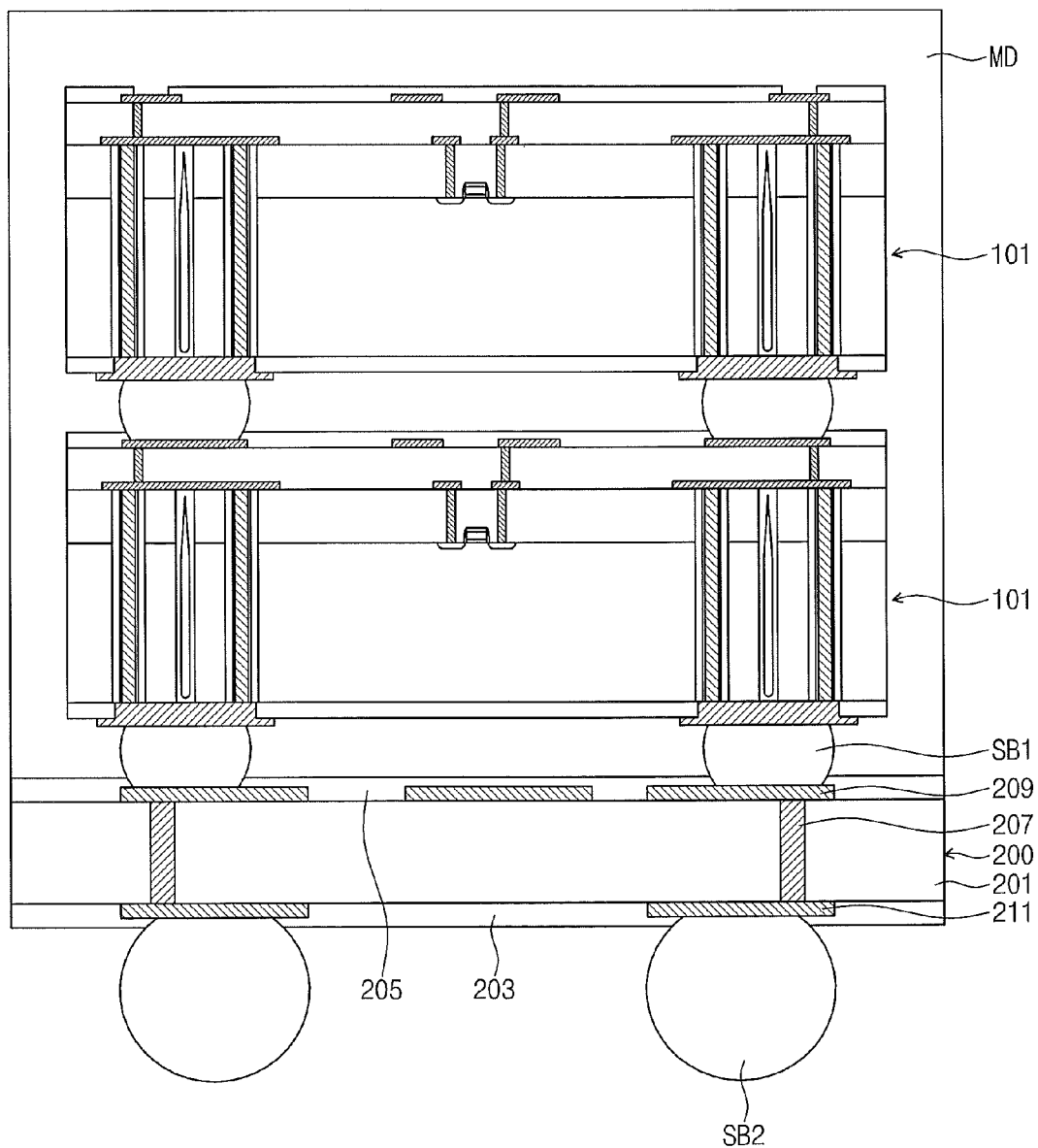

FIGS. 19 to 21 illustrate examples of semiconductor packages according to some embodiments.

Figure 22:
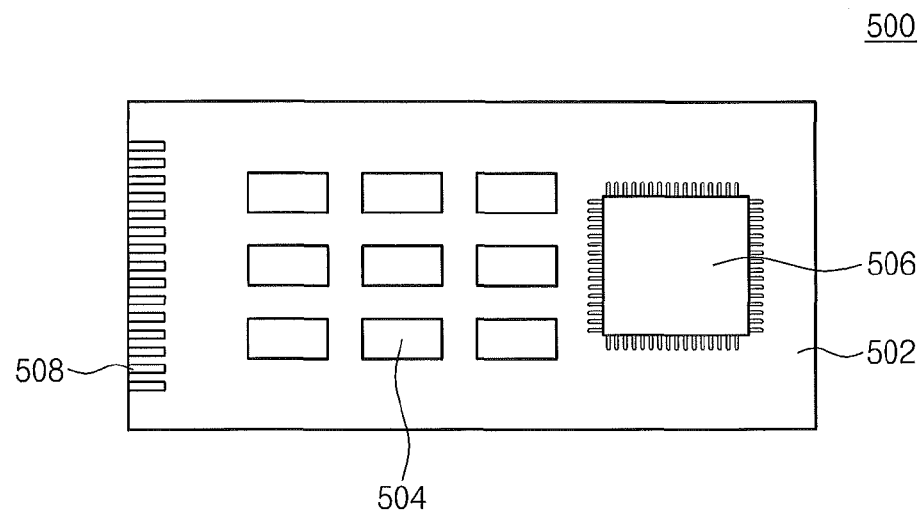

FIG. 22 is a plan view illustrating a package module according to some embodiments.

Figure 23:
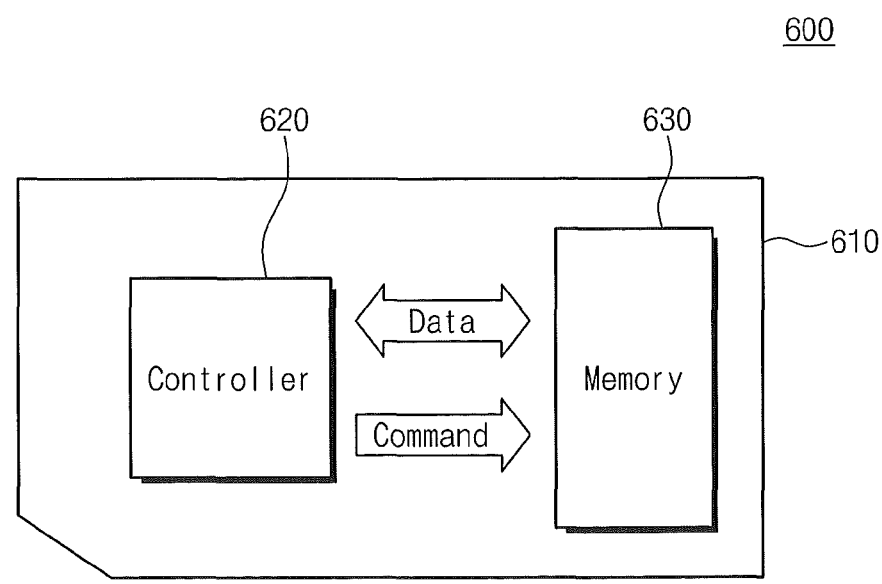

FIG. 23 is a schematic block diagram illustrating an example of memory cards including semiconductor devices according to some embodiments.

Figure 24:
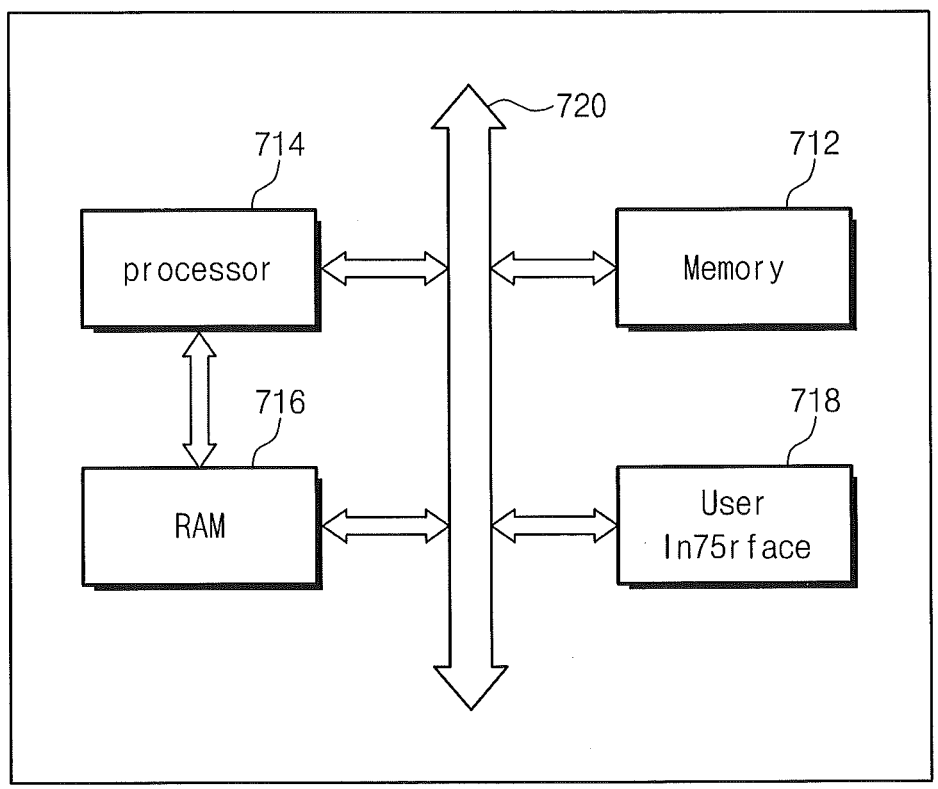

FIG. 24 is a schematic block diagram illustrating an example of electronic systems including semiconductor devices according to some embodiments.

Figure 25:
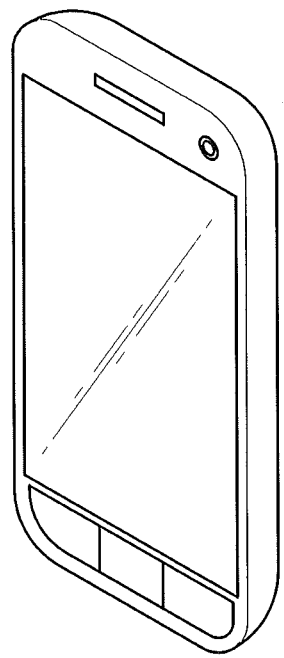

FIG. 25 is a schematic view illustrating an example of mobile phones in which semiconductor devices according to some embodiments are mounted.

DETAILED DESCRIPTION OF EMBODIMENTS

Inventive concepts will now be described more fully hereinafter with reference to the accompanying drawings, in which examples of embodiments of inventive concepts are shown. It should be noted, however, that inventive concepts are not limited to the following examples of embodiments, and may be implemented in various different forms. Rather, these embodiments are provided so that this disclosure will be thorough and complete, and will fully convey the scope of the invention to those skilled in the art. Accordingly, the examples of embodiments are provided only to disclose inventive concepts and let those skilled in the art know categories of inventive concepts. In the drawings, embodiments of inventive concepts are not limited to the specific examples provided herein and may be exaggerated for clarity.

It will be understood that when an element such as a layer, region or substrate is referred to as being "on" or "connected (or coupled) to" another element, it can be directly on or connected (or coupled) to the other element or intervening elements may be present. In contrast, the terms "directly on," "directly connected," or "directly coupled" mean that there are no intervening elements. Similarly, it will be understood that when an element such as a layer, region or substrate is referred to as being "between" two different elements, it can be directly interposed between the two different elements without any intervening element or intervening elements may be present therebetween. In contrast, the term "directly between" means that there are no intervening elements.

Moreover, it will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from teachings of the present invention. Examples of embodiments of the present inventive concepts explained and illustrated herein include their complementary counterparts. The same reference numerals or the same reference designators denote the same or similar elements throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein, but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

<First Embodiment>

Figure 1A:
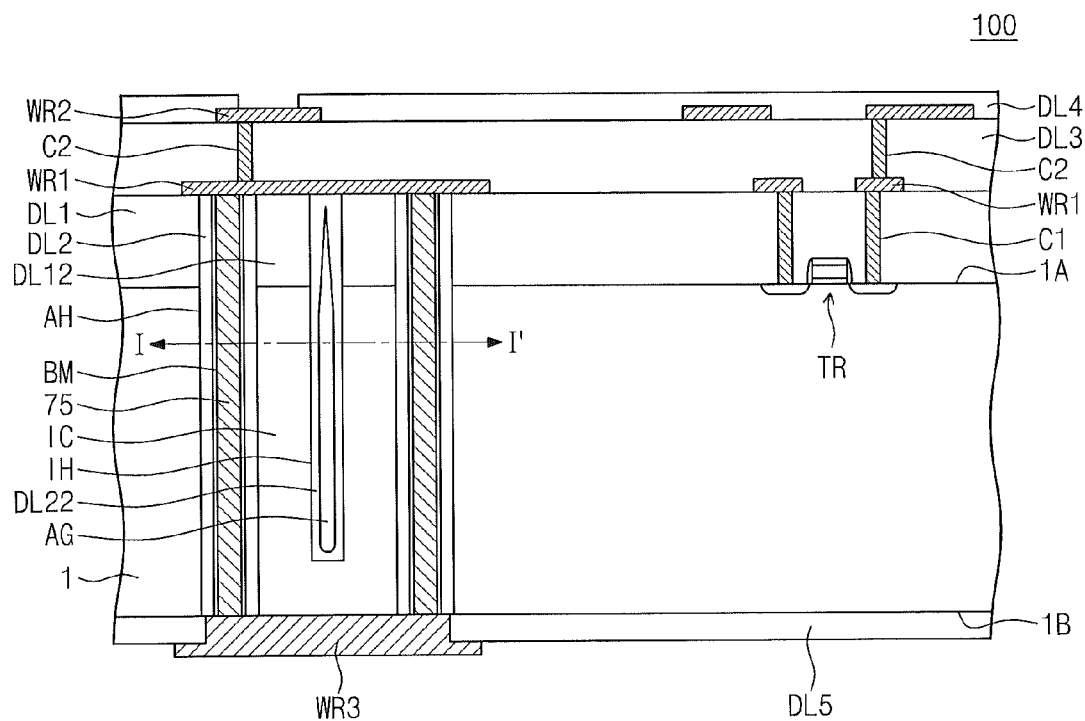
FIG. 1A is a cross sectional view illustrating a semiconductor device according to first embodiments.
Figure 1B:
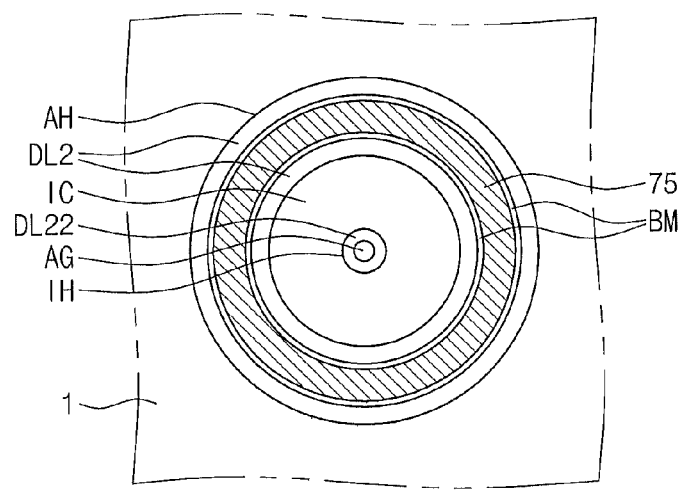
FIG. 1B is a plan view taken along a line I-I' of FIG. 1A.

FIG. 1A is a cross sectional view illustrating a semiconductor device according to first embodiments, and FIG. 1B is a plan view taken along a line I-I' of FIG. 1A.

Referring to FIGS. 1A and 1B, a semiconductor device 100 according to present embodiments may include a substrate 1. The substrate 1 may have a first surface 1A and a second surface 1B opposite to the first surface 1A. The substrate 1 may be a semiconductor substrate. One or more transistors TR may be disposed on the first surface 1A of the substrate 1. The transistors TR may be covered with a first interlayer insulation layer DL1. First contacts C1 may be disposed to penetrate the first interlayer insulation layer DL1 and may be connected to source/drain regions of the transistors TR.

A through silicon via (TSV) electrode 75 may vertically penetrate the first interlayer insulation layer DL1 and the substrate 1. The TSV electrode 75 may have an annular shape in a plan view, as illustrated in FIG. 1B. That is, the TSV electrode 75 may have a pipe-shaped structure when viewed from a three dimensional drawing. The TSV electrode 75 may be disposed in an outer trench AH having an annular shape in a plan view. A portion (e.g., an isolated substrate portion IC) of the substrate 1 may be surrounded by the outer trench AH. Thus, the isolated substrate portion IC may be isolated and/or separated from the outside substrate 1 by the outer trench AH. Further, a portion (e.g., an isolated interlayer insulation portion DL12) of the first interlayer insulation layer DL1 may be surrounded by the outer trench AH. Thus, the isolated interlayer insulation portion DL12 may be isolated and/or separated from the outside first interlayer insulation layer DL1 by the outer trench AH.

An inner hole IH may be disposed in the isolated substrate portion IC. The inner hole IH may have a circular shape in a plan view. The outer trench AH and the inner hole IH may have the same central point when viewed from a plan view. A buffer insulation layer DL22 and a buffer portion AG may be disposed in the inner hole IH. The buffer insulation layer DL22 may be replaced by a buffer conductive layer. In some embodiments, the buffer portion AG may be an air gap. The air gap AG may be defined by the buffer insulation layer DL22. That is, the air gap AG may be surrounded by the buffer insulation layer DL22. An insulation liner DL2 and a diffusion barrier layer BM may be disposed in the outer trench AH. Although not shown in the drawings, a seed layer may be disposed between the diffusion barrier layer BM and the TSV electrode 75. If the buffer insulation layer DL22 is replaced by a buffer conductive layer, the buffer conductive layer may include the same material as the diffusion barrier layer BM, the seed layer, and/or the TSV electrode 75. The diffusion barrier layer BM may include a titanium (Ti) layer, a titanium nitride (TiN) layer, a tantalum (Ta) layer, a tantalum nitride (TaN) layer, a ruthenium (Ru) layer, a cobalt (Co) layer, a manganese (Mn) layer, a tungsten nitride (WN) layer, a nickel (Ni) layer, a nickel boride (NiB) layer, a double layered material such as a titanium/titanium nitride (Ti/TiN) layer, or a combination thereof. The diffusion barrier layer BM may reduce or prevent metal atoms in the TSV electrode 75 from diffusing into the substrate 1. The TSV electrode 75 may include silver (Ag), gold (Au), copper (Cu), aluminum (Al), tungsten (W) and/or indium (In).

The insulation liner DL2 and the buffer insulation layer DL22 may include a same material layer. Each of the insulation liner DL2 and the buffer insulation layer DL22 may include a silicon oxide layer, a silicon nitride layer or a combination thereof. A bottom surface of the inner hole IH may be located at a higher level than a bottom surface of the TSV electrode 75. The isolated substrate portion IC may have a cup-shaped structure when viewed in three dimensions.

First interconnection lines WR1 may be disposed on the first interlayer insulation layer DL1. Each of the first interconnection lines WR1 may be connected to the TSV electrode 75 and/or one of the first contacts C1. A second interlayer insulation layer DL3 may be disposed to cover the first interlayer insulation layer DL1 and the first interconnection lines WR1. The second interlayer insulation layer DL3 may include a silicon oxide layer. Second interconnection lines WR2 may be disposed on the second interlayer insulation layer DL3. Some of the second interconnection lines WR2 may be electrically connected to some of first interconnection lines WR1 through second contacts C2 formed in the second interlayer insulation layer DL3.

A first passivation layer DL4 may be disposed to cover the second interlayer insulation layer DL3 and to expose one or more portions of the second interconnection lines WR2. The first passivation layer DL4 may protect integrated circuits including the transistor TR from an external environment. The first passivation layer DL4 may include a silicon oxide layer, a silicon nitride layer, a combination of a silicon oxide layer and a silicon nitride layer, and/or a polymer layer such as a polyimide layer. Each of the interconnection lines WR1 and WR2 may include an aluminum layer and/or a copper layer. Each of the contacts C1 and C2 may include an aluminum layer, a copper layer, and/or a tungsten layer.

A second passivation layer DL5 may be disposed on the second surface 1B of the substrate 1 opposite to the first surface 1A. A third interconnection line WR3 may be disposed on the second passivation layer DL5 and may be connected to the TSV electrode 75 through the second passivation layer DL5. The second passivation layer DL5 may include a silicon oxide layer, a silicon nitride layer, a combination of a silicon oxide layer and a silicon nitride layer, and/or a polymer layer such as a polyimide layer. The third interconnection line WR3 may include metal, for example, copper. The third interconnection line WR3 may correspond to a pad, a bump, and/or a redistributed line. The third interconnection line WR3 may be formed using a sputtering process and/or an electroplating process.

In general, semiconductor elements such as the transistor TR formed adjacent to the TSV electrode 75 may exhibit poor electrical characteristics and/or poor reliability due to a thermal stress caused by a coefficient of thermal expansion mismatch between the metal TSV electrode 75 and the semiconductor substrate 1. Thus, a keep-out zone (KOZ) in which formation of the semiconductor elements is forbidden or should be avoided may exist in the substrate 1. Semiconductor devices having a conventional TSV electrode structure may have a keep-out zone (KOZ) of at least about 5~20 μm. That is, in conventional semiconductor devices, the semiconductor element should be formed to be spaced apart from the conventional through silicon via (TSV) electrode by at least 5~20 μm.

However, according to some embodiments of present inventive concepts, the TSV electrode 75 may have a pipe-shaped structure with an empty space therein and the buffer portion AG spaced apart from the TSV electrode 75 may be disposed inside the TSV electrode 75. Accordingly, a thermal stress from the pipe-shaped TSV electrode 75 may be less than that from a TSV electrode having a columnar structure or a pillar structure without any buffer portions therein. That is, the buffer portion AG may alleviate the thermal stress generated from the pipe-shaped TSV electrode 75. The buffer insulation layer DL22 may also alleviate the thermal stress generated from the pipe-shaped TSV electrode 75.

Thus, in the event that the buffer portion AG and/or the buffer insulation layer DL22 is formed in a region surrounded by the TSV electrode 75, the buffer portion AG and/or the buffer insulation layer DL22 can reduce or prevent degradation of electrical characteristics and/or reliability of the transistor TR degrading even though the transistor TR is formed at a location which is spaced apart from the TSV electrode 75 by a distance of about 0.5 μm to about 5 μm. Therefore, it may be possible to reduce the keep-out zone (KOZ) from TSV electrode 75 to about 5 μm or less, or even to about 0.5 μm or less in some embodiments. That is, the keep-out zone (KOZ) from the TSV electrode 75 may be reduced due to the presence of the buffer portion AG and/or the buffer insulation layer DL22. Consequently, an integration density of the semiconductor device may be increased. As such, electrical characteristics and reliability of semiconductor elements such as the transistor TR can be improved due to the presence of the buffer portion AG and/or the buffer insulation layer DL22. Further, the buffer portion AG and/or the buffer insulation layer DL22 may reduce and/or prevent generation of cracks or crystalline defects in the substrate 1.

The semiconductor device 100 may be an interposer, a logic chip, or a memory chip.

Examples of methods of fabricating a semiconductor device 100 according to some embodiments will be now described. FIGS. 2, 3A, 4A, 7 and 8 are cross sectional views illustrating operations of forming a semiconductor device shown in FIGS. 1A and 1B. FIG. 3B is a perspective view illustrating a portion of FIG. 3A, and FIG. 4B is an enlarged view illustrating a portion 'B' of FIG. 4A.

Figure 2:
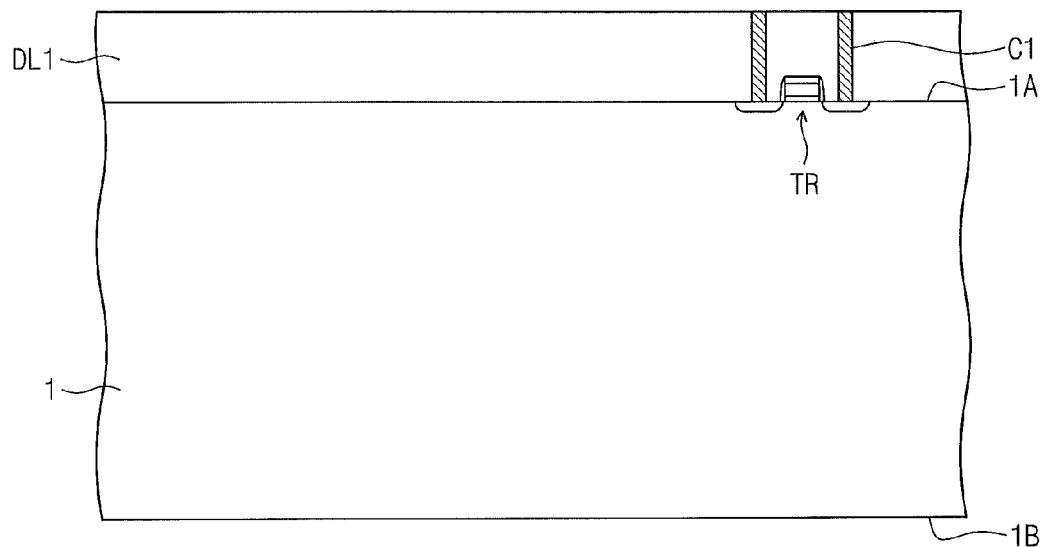
FIGS. 2, 3A, 4A, 7 and 8 are cross sectional views illustrating operations of forming a semiconductor device shown in FIGS. 1A and 1B.
Figure 3A:
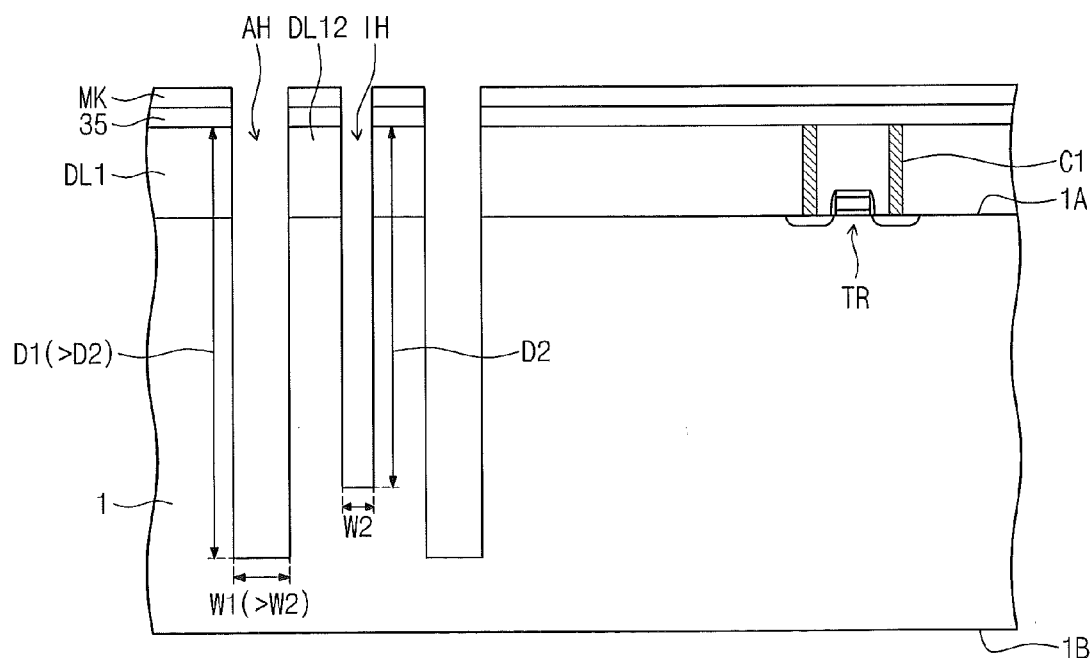
Figure 3B:
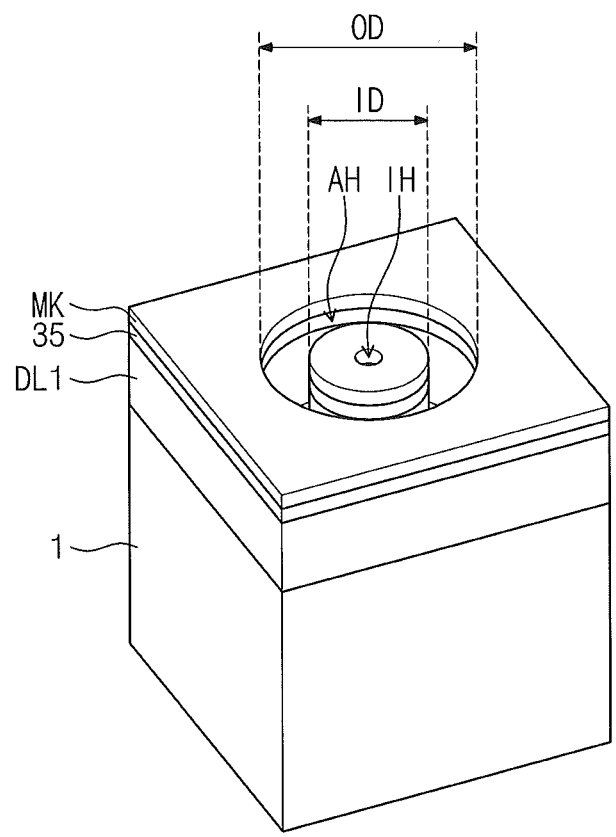
FIG. 3B is a perspective view illustrating a portion of FIG. 3A.

Referring to FIG. 2, a substrate 1 including a first surface 1A and a second surface 1B opposite to the first surface 1A may be provided. The substrate 1 may be a semiconductor substrate. A transistor TR may be formed on the first surface 1A of the substrate 1. FIG. 2 illustrates a single transistor. However, a number of transistors TR is not limited to one. For example, a number of transistors TR may be two or more in some embodiments. A first interlayer insulation layer DL1 may be formed on the first surface 1A to cover transistor TR. First contacts C1 may be formed to penetrate the first interlayer insulation layer DL1. The first contacts C1 may be electrically connected to source/drain regions of the transistor TR.

Referring to FIGS. 3A and 3B, an etch stop layer 35 may be formed on the first interlayer insulation layer DL1. The etch stop layer 35 may be formed of a silicon carbide (SiC) layer, a silicon nitride (SiN) layer, and/or a silicon carbon nitride (SiCN) layer. The etch stop layer 35 may be formed to a thickness of about 500 angstroms (Å). A mask pattern MK may be formed on the etch stop layer 35. The mask pattern MK may be formed of a photoresist layer or a silicon nitride layer. The etch stop layer 35, the first interlayer insulation layer DL1 and the substrate 1 may be etched using the mask pattern MK as an etch mask, thereby forming an inner hole IH having a circular shape in a plan view and an outer trench AH having an annular shape surrounding the inner hole IH in a plan view. The inner hole IH and the outer trench AH may be simultaneously or independently formed. Half (hereinafter, referred to as a first width W1) of a difference between an outer diameter OD and an inner diameter ID of the outer trench AH may be greater than a diameter (hereinafter, referred to as a second width W2) of the inner hole IH. Even though the inner hole IH and the outer trench AH are simultaneously formed using the same etching process, a first depth D1 of the outer trench AH may be greater than a second depth D2 of the inner hole IH. This may be due to the nature of the etching process. That is, if a width of an opening of a mask pattern defining a hole and/or a trench decreases, an etchant or an etching gas may be less efficiently and/or insufficiently supplied into a hole or a trench during an etching process. Accordingly, a chemical reaction in the inner hole IH may progress more slowly than the chemical reaction in the outer trench AH. Consequently, a depth of a hole or a trench designed to have a relatively narrower width may be less than a depth of a hole or a trench designed to have a relatively wider width even though both are etched at the same time.

After formation of the outer trench AH, a portion of the first interlayer insulation layer DL1 surrounded by the outer trench AH may be isolated from the outside first interlayer insulation layer DL1 of the outer trench AH. That is, an isolated interlayer insulation portion DL12 may be formed inside the outer trench AH. In some embodiments, when the first width W1 is about 10 micrometers (μm) and the second width W2 is about 5 micrometers (μm), the first depth D1 may be about 60 micrometers (μm) and the second depth D2 may be in the range of about 40 micrometers (μm) to about 50 micrometers (μm). After formation of the inner hole IH and the outer trench AH, the mask pattern MK may be removed.

Figure 4A:
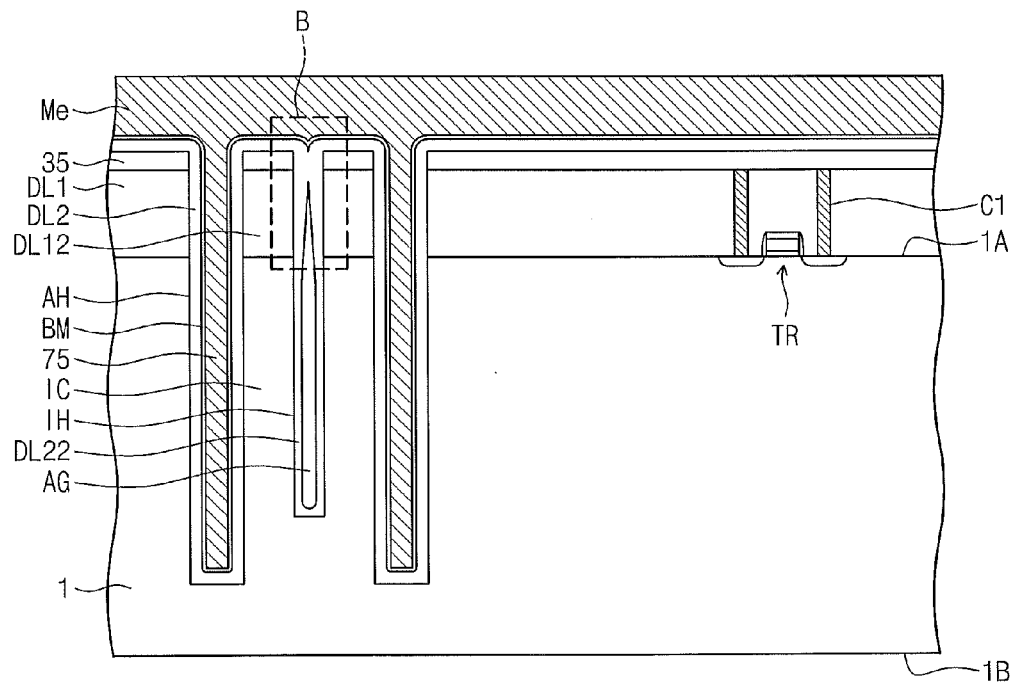
Figure 4B:
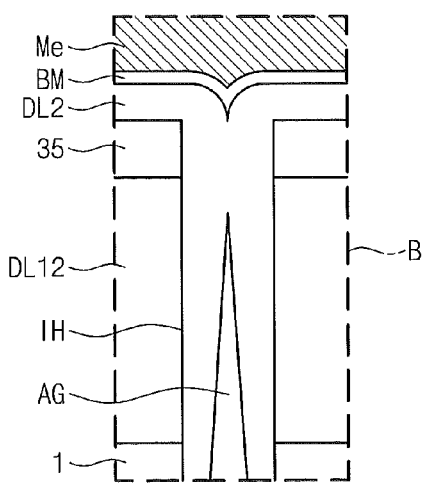
FIG. 4B is an enlarged view illustrating a portion 'B' of FIG. 4A.

Referring to FIGS. 4A and 4B, an insulation liner DL2 may be conformally formed on an entire surface of the substrate where the mask pattern MK is removed. The insulation liner DL2 may be formed using a chemical vapor deposition (CVD) process or a physical vapor deposition (PVD) process. Even though the insulation liner DL2 is conformally formed, the insulation liner DL2 may be formed to have overhangs on upper corners of the inner hole IH and the outer trench AH. This may be due to the nature of the deposition process. That is, the overhangs of the insulation liner DL2 may be thicker than the insulation liner DL2 deposited on inner sidewalls of the inner hole IH and the outer trench AH. Thus, the overhang on the inner hole IH may close the inner hole IH surrounded by the insulation liner DL2, whereas the outer trench AH surrounded by the insulation liner DL2 may remain open even though the insulation liner DL2 is formed to have the overhangs. This is because the first width W1 of the outer trench AH is greater than the second width W2 of the inner hole IH. Accordingly, a buffer portion AG may be formed in the inner hole IH. That is, the buffer portion AG may correspond to an air gap having an empty space. In some embodiments, when the second width W2 is equal to or less than about 0.5 micrometers, the inner hole IH may be more readily closed by the overhang of the insulation liner DL2. Meanwhile, when the first width W1 is greater than about 0.5 micrometers, the outer trench AH may remain open even though the insulation liner DL2 is formed to have the overhangs.

Referring still to FIGS. 4A and 4B, a diffusion barrier layer BM may be conformally formed on the insulation liner DL2 and a through silicon via (TSV) electrode layer Me may be formed on the diffusion barrier layer BM to fill the outer trench AH. The diffusion barrier layer BM may be formed using a chemical vapor deposition (CVD) process and/or an atomic layer deposition (ALD) process. The TSV electrode layer Me may be formed using an electroplating process. A seed layer may be additionally formed on the diffusion barrier layer BM prior to formation of the TSV electrode layer Me. In the event that an inlet of the inner hole IH is closed by the overhang of the insulation liner DL2, the diffusion barrier layer BM and the TSV electrode layer Me may not be formed in the inner hole IH.

Figure 5A:
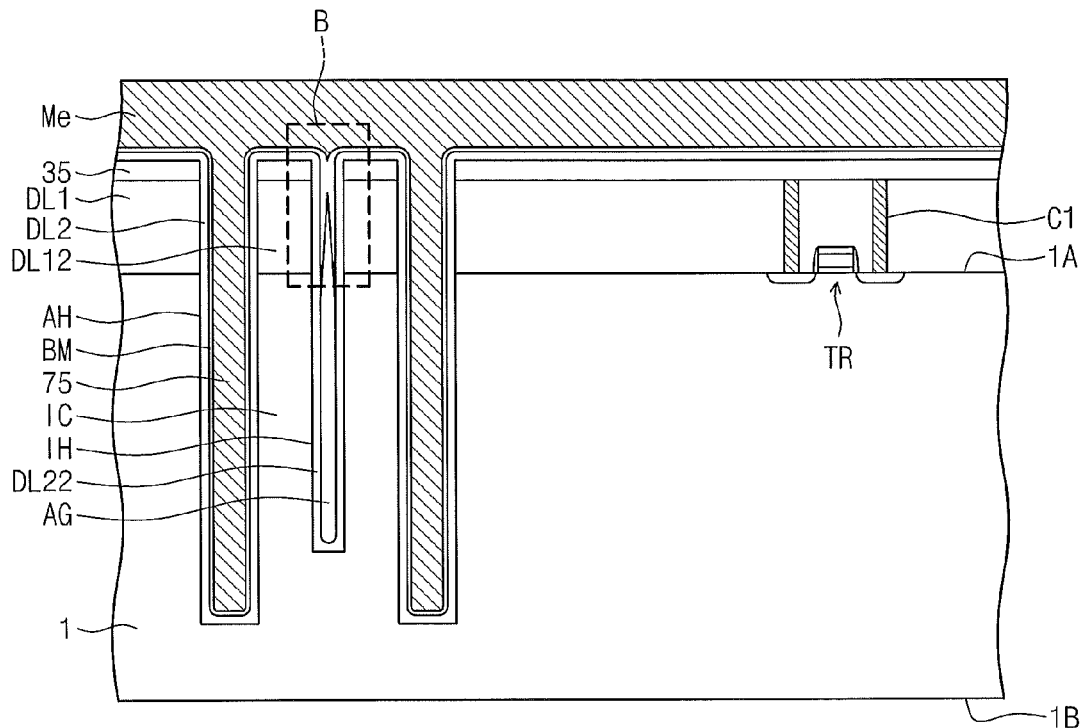
FIG. 5A is a cross sectional view illustrating a modified embodiment of FIG. 4A.
Figure 5B:
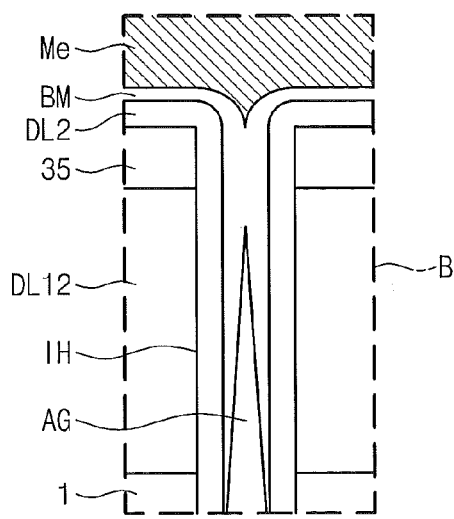
FIG. 5B is an enlarged view illustrating a portion 'B' of FIG. 5A.

FIG. 5A is a cross sectional view illustrating a modified embodiment of FIG. 4A, and FIG. 5B is an enlarged view illustrating a portion 'B' of FIG. 5A.

Referring to FIGS. 5A and 5B, the inlet of the inner hole IH may not be closed by the insulation liner DL2, but the inlet of the inner hole IH may be closed by the diffusion barrier layer BM and/or the seed layer to form the buffer portion AG, for example, an air gap. In the event that the inlet of the inner hole IH is closed by the diffusion barrier layer BM and/or the seed layer, the second width W2 of the inner hole IH may be equal to or less than about 1 micrometer and the first width W1 of the outer trench AH may be greater than 1 micrometer.

Figure 6A:
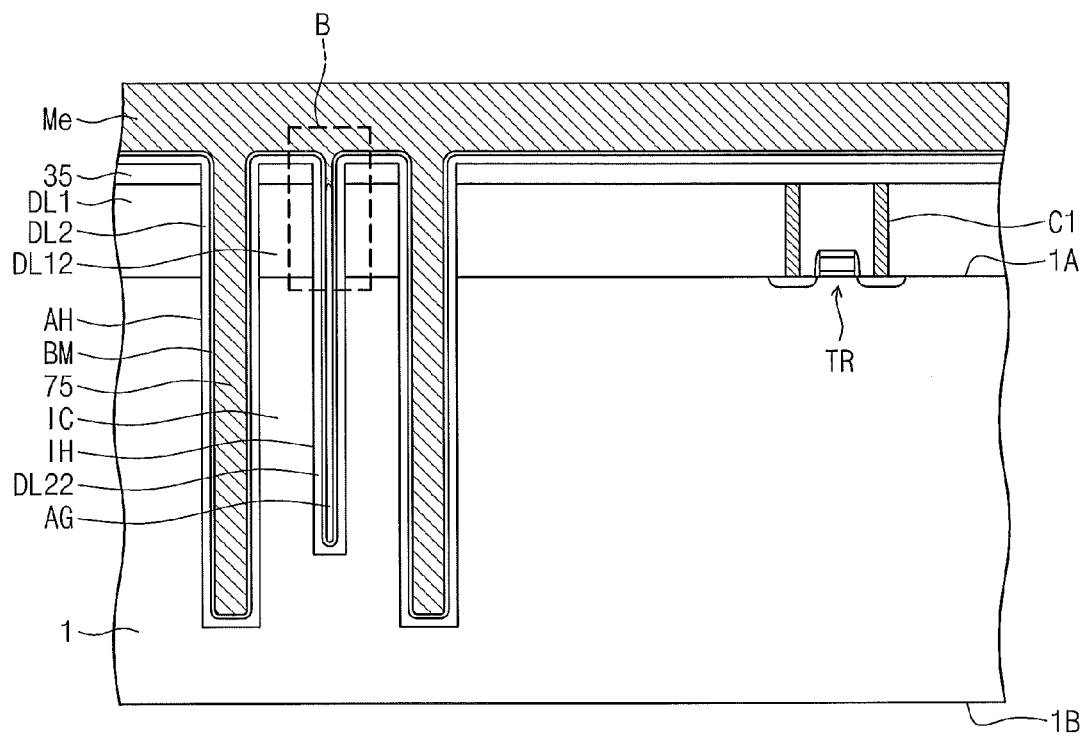
FIG. 6A is a cross sectional view illustrating another modified embodiment of FIG. 4A.
Figure 6B:
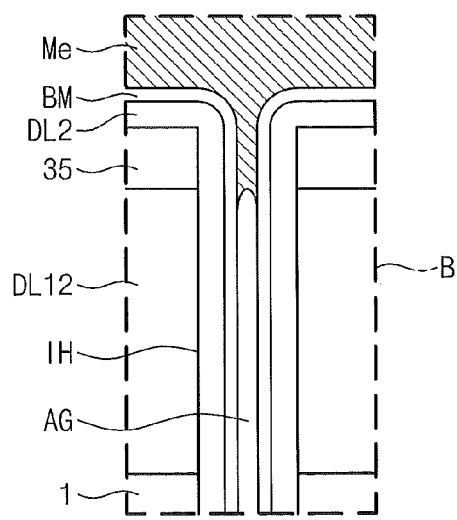
FIG. 6B is an enlarged view illustrating a portion 'B' of FIG. 6A.

FIG. 6A is a cross sectional view illustrating another modified embodiment of FIG. 4A, and FIG. 6B is an enlarged view illustrating a portion 'B' of FIG. 6A.

Referring to FIGS. 6A and 6B, the inlet of the inner hole IH may be closed by the TSV electrode layer Me to form the buffer portion AG, for example, an air gap.

Figure 7:
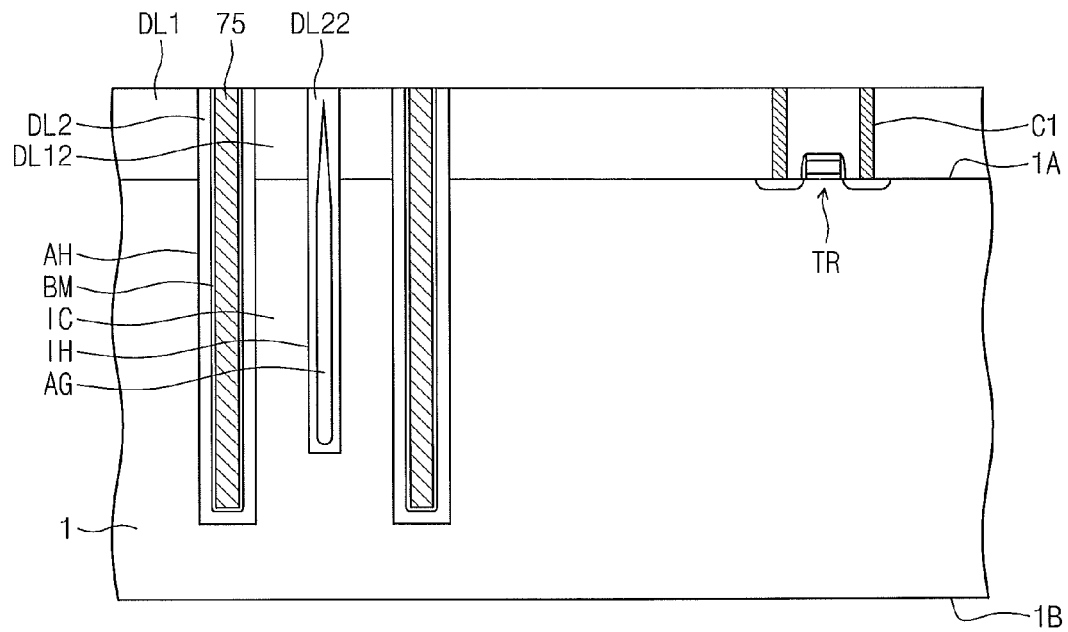

Referring to FIG. 7, after formation of the TSV electrode layer Me illustrated in FIG. 4A, the TSV electrode layer Me, the diffusion barrier layer BM and the insulation liner DL2 on a top surface of the etch stop layer 35 may be removed using a planarization process. During the planarization process, the etch stop layer 35 may act as a planarization stopper and the etch stop layer 35 may be damaged. The damaged etch stop layer 35 may be removed to expose a top surface of the first interlayer insulation layer DL1. Consequently, a through silicon via (TSV) electrode 75 and a buffer insulation layer DL22 may be simultaneously formed in the outer trench AH and in the inner hole IH, respectively. The buffer insulation layer DL22 may be composed of portions of the insulation liner DL2 remaining in the inner hole IH.

Figure 8:
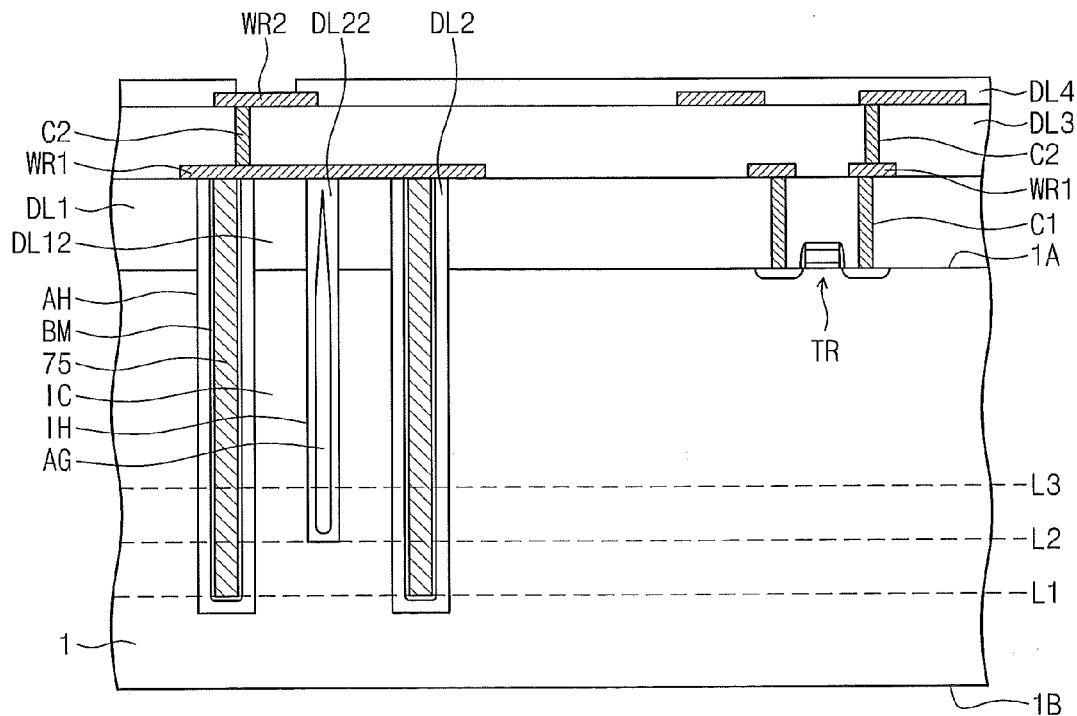

Referring to FIG. 8, first interconnection lines WR1 may be formed on the first interlayer insulation layer DL1. The first interconnection lines WR1 may be electrically connected to the TSV electrode 75 and/or the first contacts C1. A second interlayer insulation layer DL3 may then be formed on the first interlayer insulation layer DL1 to cover the first interconnection lines WR1. Second contacts C2 may be formed in the second interlayer insulation layer DL3 to contact the first interconnection lines WR1. Second interconnection lines WR2 may be formed on the second interlayer insulation layer DL3 and some of the second interconnection lines WR2 may be electrically connected to the second contacts C2. A first passivation layer DL4 may be formed on the second interlayer insulation layer DL3 partially exposing some of the second interconnection lines WR2. A back-grinding process may be applied to the second surface 1B of the substrate 1 to remove a back side portion of the substrate 1. The back-grinding process may be performed until one of the surfaces indicated by first to third dotted lines L1, L2 and L3 is exposed. The first dotted line L1 may be located at the same level as a bottom surface of the TSV electrode 75, and the second dotted line L2 may be located at the same level as a bottom surface of the inner hole IH. Further, the third dotted line L3 may horizontally pass through an inside region of the buffer portion AG. The semiconductor device 100 illustrated in FIGS. 1A and 1B may be formed by back-grinding the substrate 1 until a surface indicated by the first dotted line L1 is exposed. Stated in other words, a back-grinding process may be performed to at least expose portions of TSV electrode 75.

Referring again to FIGS. 1A and 1B, as a result of the back-grinding process, the bottom surface of the TSV electrode 75 may be exposed and an isolated substrate portion IC may be formed in a region surrounded by the TSV electrode 75. The isolated substrate portion IC may be isolated from outside portions of substrate 1 by the TSV electrode 75. The isolated substrate portion IC may be formed to have a cup-shaped structure. Subsequently, a second passivation layer DL5 may be formed on the second surface 1B of the substrate 1. A portion of the second passivation layer DL5 may be removed to expose a bottom surface of the TSV electrode 75. A third interconnection line WR3 may be formed to cover the exposed bottom surface of the TSV electrode 75. That is, the third interconnection line WR3 may be electrically connected to the TSV electrode 75.

Although not shown in the drawings, subsequent processes of the modified embodiments illustrated in FIGS. 5A and 6A may be the same as described with reference to FIGS. 7, 8, 1A and 1B. However, according to the modified embodiments illustrated in FIGS. 5A and 6A, the buffer portion AG may be closed by any one of the diffusion barrier layer BM, the seed layer, and/or the TSV electrode layer Me.

<Second Embodiments>

Figure 9:
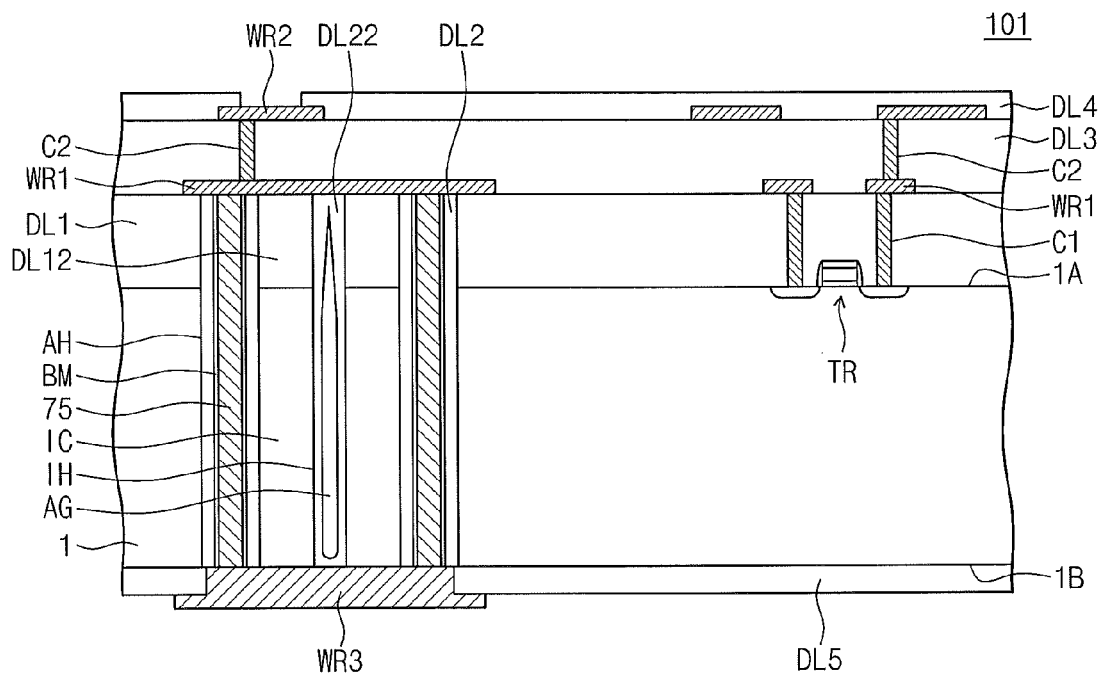
FIG. 9 is a cross sectional view illustrating a semiconductor device according to second embodiments.

FIG. 9 is a cross sectional view illustrating a semiconductor device according to second embodiments.

Referring to FIG. 9, a semiconductor device 101 according to present embodiments may be formed such that a bottom surface of the TSV electrode 75 is coplanar with a bottom surface of the inner hole IH. Thus, the isolated substrate portion IC in the outer trench AH may have a pipe-shaped structure. That is, forming the semiconductor device 101 may include back-grinding the substrate 1 until a surface indicated by the second dotted line L2 is exposed in the process stage of FIG. 8. The semiconductor device 101 may be formed using the same or similar processes as described in first embodiments except for the back-grinding process.

<Third Embodiments>

Figure 10:
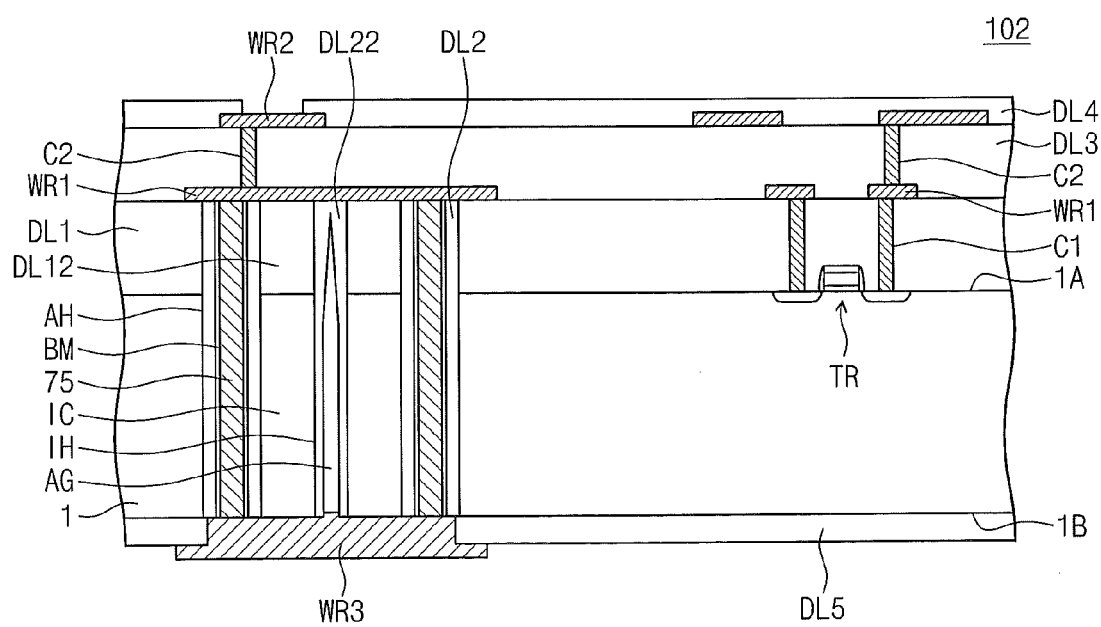
FIG. 10 is a cross sectional view illustrating a semiconductor device according to third embodiments.

FIG. 10 is a cross sectional view illustrating a semiconductor device according to third embodiments.

Referring to FIG. 10, a semiconductor device 102 according to present embodiments may be formed such that a bottom surface of the TSV electrode 75 is coplanar with a bottom surface of the buffer insulation layer DL22. Further, a lower inlet of the inner hole IH may be closed by the third interconnection lines WR3. An uppermost surface of the third interconnection line WR3 may be located at a higher level than a bottom surface of the buffer insulation layer DL22. That is, a portion of the third interconnection line WR3 may extend into the inner hole IH. The buffer portion AG, (for example, the air gap) may be defined and surrounded by the third interconnection line WR3 and the buffer insulation layer DL22. The lower inlet of the inner hole IH may be closed by the third interconnection line WR3, as illustrated in FIG. 10. Alternatively, the lower inlet of the inner hole IH may be closed by a portion of the second passivation layer DL5 instead of the third interconnection line WR3. According to present embodiments, a vertical length of the buffer portion AG (for example, the air gap) may be substantially equal to a vertical length of the TSV electrode 75. Thus, the buffer portion AG may more readily absorb a thermal stress of the TSV electrode 75 throughout the region between the top and bottom surfaces of the TSV electrode 75.

Forming the semiconductor device 102 may include back-grinding the substrate 1 until a surface indicated by the second dotted line L3 is exposed in the process stage of FIG. 8. If a portion of the substrate 1 is removed using the back-grinding process until a surface indicated by the second dotted line L3 is exposed, the lower inlet of the buffer portion AG (e.g., an air gap) may be exposed and opened. However, the lower inlet of the buffer portion AG (e.g., the air gap) may be closed by the second passivation layer DL5 and/or the third interconnection line WR3 formed in a subsequent process.

The semiconductor device 102 may be formed using the same or similar processes as described in first embodiments except for the aforementioned processes and configurations.

<Fourth Embodiments>

Figure 11:
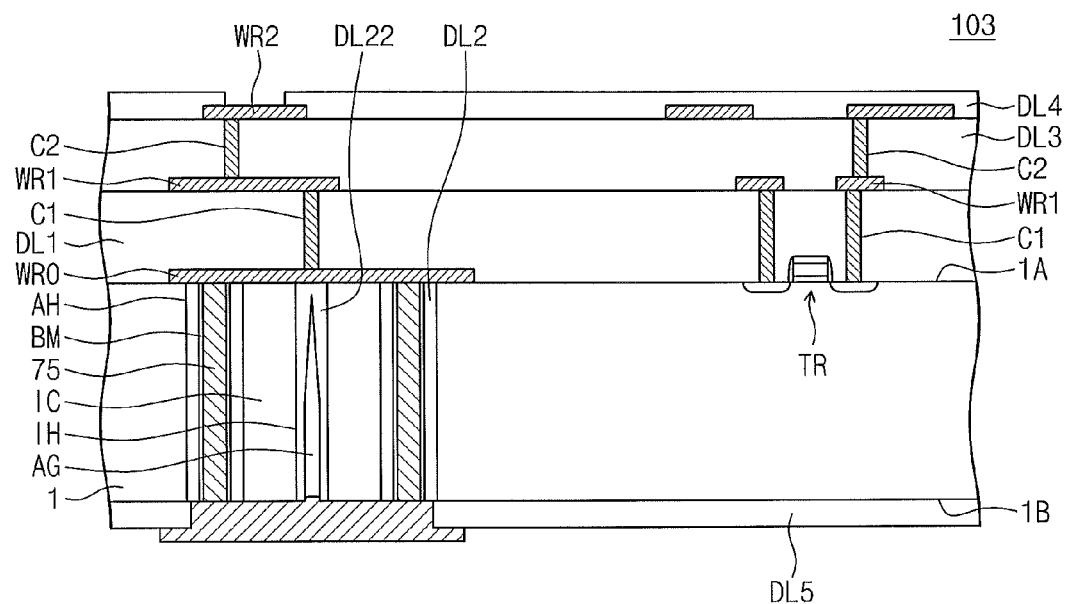

FIG. 11 is a cross sectional view illustrating a semiconductor device according to fourth embodiments.

Referring to FIG. 11, a semiconductor device 103 according to present embodiments may be formed such that the TSV electrode 75 and the buffer portion AG are disposed only in the substrate 1. An auxiliary interconnection line WR0 may be formed on the TSV electrode 75 to contact a bottom surface of one of the first contacts C1.

In some embodiments, the TSV electrode 75 and the buffer portion AG may be formed prior to formation of the transistor TR.

The semiconductor device 103 according to present embodiments may be formed using the same or similar processes as described in third embodiments except for the aforementioned processes and configurations.

<Fifth Embodiments>

FIG. 12 is a cross sectional view illustrating a semiconductor device according to fifth embodiments.

Referring to FIG. 12, a semiconductor device 104 according to present embodiments may be formed such that the TSV electrode 75 penetrates the second interlayer insulation layer DL3, the first interlayer insulation layer DL1 and the substrate 1 to contact one of the second interconnection lines WR2. The buffer portion AG may be formed to penetrate the second interlayer insulation layer DL3, the first interlayer insulation layer DL1 and a portion of the substrate 1. A portion (e.g., an isolated second interlayer insulation portion DL32) of the second interlayer insulation layer DL3 may be surrounded by the TSV electrode 75. That is, the isolated second interlayer insulation portion DL32 may be isolated from the outside second interlayer insulation layer DL3 of the TSV electrode 75 by the TSV electrode 75. The isolated substrate portion IC may have a cup-shaped structure.

In some embodiments, the TSV electrode 75 and the buffer portion AG may be formed after the first interlayer insulation layer DL1, the first contacts C1, the first interconnection lines WR1, the second interlayer insulation layer DL3 and the second contacts C2 are formed on the substrate 1.

The semiconductor device 104 according to present embodiments may be formed using the same or similar processes as described in first embodiments except the aforementioned processes and configurations.

<Sixth Embodiments>

FIG. 13 is a cross sectional view illustrating a semiconductor device according to sixth embodiments.

Referring to FIG. 13, a semiconductor device 105 according to present embodiments may be formed such that the TSV electrode 75 penetrates the second interlayer insulation layer DL3, the first interlayer insulation layer DL1, and the substrate 1 to contact one of the second interconnection lines WR2. The buffer portion AG may be formed to penetrate the substrate 1, the first interlayer insulation layer DL1 and a portion of the second interlayer insulation layer DL3. The isolated substrate portion IC may be formed to have a pipe-shaped structure, and the isolated second interlayer insulation portion DL32 may be formed to have a flipped or reversed cup-shaped structure.

The semiconductor device 105 may be fabricated by: forming the transistor TR, the first interlayer insulation layer DL1, the first contacts C1, the first interconnection lines WR1, the second interlayer insulation layer DL3, the second contacts C2, the second interconnection lines WR2 and the first passivation layer DL4 on the first surface 1A of the substrate 1; removing a portion of the substrate 1 adjacent to the second surface 1B using a back-grinding process; forming the outer trench AH and the inner hole IH that extend from the second surface 1B toward the second interlayer dielectric layer DL3; and forming the TSV electrode 75 and the buffer portion AG in the outer trench AH and the inner hole IH respectively.

The semiconductor device 105 according to present embodiments may be formed using the same or similar processes as described in fifth embodiments except the aforementioned processes and configurations.

<Seventh Embodiments>

FIG. 14A is a cross sectional view illustrating a semiconductor device according to seventh embodiments, and FIG. 14B is a plan view taken along a line I-I' of FIG. 14A.

Referring to FIGS. 14A and 14B, a semiconductor device 106 according to present embodiments may be formed such that the an inner trench MH having an annular shape in a plan view is additionally disposed between the inner hole IH and the outer trench AH. That is, the inner trench MH may be formed to surround the inner hole IH. Half of a difference between an outer diameter and an inner diameter of the inner trench MH may be less than a width (e.g., the first width W1) of the outer trench AH. A second buffer insulation layer DL23 may be disposed in the inner trench MH. The second buffer insulation layer DL23 may be formed to include a seam SM therein. The seam SM may act as another buffer portion. That is, according to present embodiments, the buffer portion may include the first buffer portion AG and the second buffer portion SM.

Alternatively, the number of the buffer portions may be three or more. If the number of the buffer portions is three or more, one of the buffer portions may be disposed to surround an outer sidewall of the TSV electrode 75 and to be spaced apart from the TSV electrode 75.

The semiconductor device 106 according to present embodiments may be formed using the same or similar processes as described in fifth embodiments except the aforementioned processes and configurations.

<Eighth Embodiments>

FIG. 15A is a cross sectional view illustrating a semiconductor device according to eighth embodiments, and FIG. 15B is a plan view taken along a line I-I' of FIG. 15A.

Referring to FIGS. 15A and 15B, a semiconductor device 107 according to present embodiments may be formed such that the buffer portion AG may be disposed in the isolated substrate portion IC and the isolated interlayer insulation portion DL12 without the buffer insulation layer DL22. That is, a whole space in the inner hole IH may correspond to the buffer portion AG, for example, an air gap. In this case, an upper inlet of the inner hole IH may be closed by a portion of one of the first interconnection lines WR1. A lowermost bottom surface of the first interconnection lines WR1 may be located a lower level than a top surface of the isolated interlayer insulation portion DL12. That is, a portion of the first interconnection line WR1 covering the inner hole IH may be formed to extend into the inner hole IH.

In some embodiments, the inner hole IH and the outer trench AH may be independently formed using two separated process steps. That is, after the TSV electrode 75 having a pipe-shaped structure is formed to penetrate the first interlayer insulation layer DL1 and the substrate 1, the inner hole IH may be formed by etching the isolated interlayer insulation portion DL12 and the substrate 1 prior to formation of the first interconnection lines WR1. The inner hole IH may be formed to penetrate a central portion of the isolated interlayer insulation portion DL12 and to extend into the isolated substrate portion IC.

The semiconductor device 107 according to present embodiments may be formed using the same or similar processes as described in first embodiments except the aforementioned processes and configurations.

<Ninth Embodiments>

FIG. 16A is a cross sectional view illustrating a semiconductor device according to ninth embodiments, and FIG. 16B is a plan view taken along a line I-I' of FIG. 16A, Referring to FIGS. 16A and 16B, present embodiments may be similar to seventh embodiments. That is, a semiconductor device 108 according to present embodiments may be formed not to include the inner hole IH illustrated in seventh embodiments. Therefore, according to present embodiments, the semiconductor device 108 may be formed to include the inner trench MH and the outer trench AH that have annular shapes. The outer trench AH may be formed to surround outer sidewall of the inner trench MH and to be spaced part from the inner trench MH. Half of a difference between an outer diameter and an inner diameter of the inner trench MH may be less than a width (e.g., the first width W1) of the outer trench AH. A second buffer insulation layer DL23 may be disposed in the inner trench MH, as illustrated in seventh embodiments of FIG. 14A. Thus, the second buffer insulation layer DL23 may be formed to include a seam SM therein. Accordingly, the seam SM may act as another buffer portion. Although not shown in the drawings, an air gap may be additionally provided in the inner trench MH in some embodiments.

Processes for forming the semiconductor device 108 will be described with reference to FIGS. 17A and 17B. FIG. 17A is a cross sectional view illustrating processes for forming a semiconductor device shown in FIG. 16A, and FIG. 17B is a plan view taken along a line I-I' of FIG. 17A.

Referring to FIGS. 17A and 17B, the transistor TR, the first interlayer insulation layer DL1 and the first contacts C1 may be formed on the first surface 1A of the substrate 1 as illustrated in FIG. 2, and an etch stop layer 35 may be formed on the first interlayer insulation layer DL1 and the first contacts C1. A mask pattern MK may then be formed on the etch stop layer 35. The etch stop layer 35, the first interlayer insulation layer DL1 and the substrate 1 may be etched using mask pattern MK as an etch mask, thereby forming an inner trench MK and an outer trench AH surrounding the inner trench MK. The inner trench MK and the outer trench AH may be formed to have annular shapes, as illustrated in a plan view of FIG. 17B. Alternatively, the inner trench MK and the outer trench AH may be independently formed using two separated mask patterns.

After formation of the inner trench MK and the outer trench AH, the mask pattern MK may be removed. Subsequently, the semiconductor device 108 may be formed using the processes described in first embodiments of FIGS. 4A to 8.

Consequently, the semiconductor device 108 according to present embodiments may be formed using the same or similar processes as described in first embodiments except the aforementioned processes and configurations.

<Tenth Embodiments>

FIG. 18A is a cross sectional view illustrating a semiconductor device according to tenth embodiments, and FIG. 18B is a plan view taken along a line I-I' of FIG. 18A.

Referring to FIGS. 18A and 18B, a semiconductor device 109 according to present embodiments may be formed such that a plurality of inner holes IH are disposed to penetrate the isolated interlayer insulation portion DL12 and to extend into the isolated substrate portion IC. A buffer portion AG may be provided in each of the inner holes IH without a buffer insulation layer. That is, a whole space in each of the inner holes IH may correspond to the buffer portion AG, for example, an air gap. In this case, upper inlets of the inner holes IH may be closed by portions of one of the first interconnection lines WR1. Portions of the first interconnection line WR1 covering the inner holes IH may extend into the inner holes IH. Thus, a lowermost bottom surface of the first interconnection line WR1 may be located at a lower level than a top surface of the isolated interlayer insulation portion DL12.

In some embodiments, the inner holes IH and the outer trench AH may be independently formed using two separated process steps. That is, after the TSV electrode 75 having a pipe-shaped structure is formed to penetrate the first interlayer insulation layer DL1 and the substrate 1, the inner holes IH may be formed by etching the isolated interlayer insulation portion DL12 and the substrate 1 prior to formation of the first interconnection lines WR1. The inner holes IH may be formed to penetrate the isolated interlayer insulation portion DL12 and to extend into the isolated substrate portion IC.

The semiconductor device 108 according to present embodiments may be formed using the same or similar processes as described in first embodiments except the aforementioned processes and configurations.

FIGS. 19 to 21 illustrate examples of semiconductor packages according to some embodiments.

Referring to FIG. 19, an example 401 of a semiconductor package according to some embodiments may include a package substrate 200 and a semiconductor device 101 mounted on the package substrate 200. The semiconductor device 101 may correspond to the semiconductor device described in the second embodiments (see FIG. 9). The package substrate 200 may be a printed circuit board (PCB). The package substrate 200 may include an insulation substrate 201, a package substrate through via electrode 207 penetrating the insulation substrate 201, conductive patterns 209 and 211 disposed on top and bottom surfaces of the insulation substrate 201, and package substrate insulation layers 203 and 205 covering the conductive patterns 209 and 211. In some other embodiments, the semiconductor device 101 may correspond to one of the semiconductor devices described in first embodiments and the third to tenth embodiments.

The semiconductor device 101 may be electrically connected to the package substrate 200 through first bumps SB1. The first bumps SB1 may be attached to a top surface of the package substrate 200. Second bumps SB2 may be attached to a bottom surface of the package substrate 200 opposite the first bumps SB1. The bumps SB1 and SB2 may include solder balls, conductive bumps, conductive spacers, pin grid arrays or a combination thereof. The semiconductor package 401 may further include a mold layer MD surrounding or covering the semiconductor device 101. The mold layer MD may include an epoxy molding compound material.

Referring to FIG. 20, another example 402 of a semiconductor package according to some embodiments may include a package substrate 200 and first and second semiconductor devices 101 and 300 mounted on the package substrate 200. The package substrate 200 may be a printed circuit board (PCB). The package substrate 200 may include an insulation substrate 201, a package substrate through via electrode 207 penetrating the insulation substrate 201, conductive patterns 209 and 211 disposed on top and bottom surfaces of the insulation substrate 201, and package substrate insulation layers 203 and 205 covering the conductive patterns 209 and 211. The first semiconductor device 101 may correspond to any of the semiconductor devices described in the above first to tenth embodiments. The second semiconductor device 300 may correspond to a memory chip and/or a logic chip which is different from the first semiconductor device 101. In some embodiments, the second semiconductor device 300 may not include the TSV electrode described herein. The first and second semiconductor devices 101 and 300 may be surrounded or covered by a mold layer MD.

Referring to FIG. 21, still another example 403 of a semiconductor package according to the embodiments may include a package substrate 200 and at least two semiconductor devices 101 mounted on the package substrate 200. The semiconductor package 403 may be a multi-chip package. The semiconductor devices 101 may have a same type of configuration and/or structure in some embodiments. The semiconductor devices 101 may be surrounded or covered by a mold layer MD.

The semiconductor packages according to the above embodiments may be configured to have a structure such that at least one semiconductor device is electrically connected to the package substrate 200 by the TSV electrodes. However, it will be understood that semiconductor packages according to inventive concepts are not limited to the embodiments described above. For example, some of pads of the semiconductor devices may be electrically connected to the package substrate 200 through bonding wires.

FIG. 22 is a plan view illustrating a package 500 module according to some embodiments. Referring to FIG. 22, the package module 500 may include a module substrate 502 having terminals 508 configured to be connected to an external device, at least one semiconductor chip 504 mounted on the module substrate 502, and a semiconductor package 506 having a quad flat package (QFP) type configuration mounted on the module substrate 502. The semiconductor chip 504 and/or the semiconductor package 506 may include a semiconductor device according to embodiments described above. The package module 500 may be connected to an external electronic device through the terminals 508.

FIG. 23 is a schematic block diagram illustrating an example of memory cards including semiconductor devices and/or packages according to some embodiments. Referring to FIG. 23, the memory card 600 may include a housing 610 as well as a controller 620 and a memory 630 disposed in the housing 610. The controller 620 and the memory 630 may transmit and receive electrical data to and from each other. For example, the controller 620 and the memory 630 may transmit and receive the electrical data to and from each other according to commands from the controller 620. Thus, the memory card 600 may store the memory 630 with the data or may output the data in the memory 630 to an external device.

The controller 620 and/or the memory 630 may include at least one of the semiconductor devices and the semiconductor packages according to the embodiments described herein. The memory card 600 may be used as a data storage media of various portable systems. For example, the memory card 600 may be a multi media card (MMC) or a secure digital (SD) card.

FIG. 24 is a schematic block diagram illustrating an example of electronic systems including semiconductor devices and/or packages according to some embodiments. Referring to FIG. 24, the electronic system 700 may include at least one of the semiconductor devices and the semiconductor packages according to the embodiments of inventive concepts. The electronic system 700 may be a mobile system or a computer in some embodiments. For example, the electronic system 700 may include a memory system 712, a processor 714, a random access memory (RAM) 716 and a user interface 718. The memory system 712, the processor 714, the random access memory (RAM) 716 and the user interface 718 may communicate with each other through a data bus 720. The processor 714 may execute a program and may control the electronic system 700. The RAM 716 may be used as an operation memory of the processor 714. For example, the processor 714 and the RAM 716 may include one of the semiconductor devices according to embodiments of the inventive concepts and/or one of the semiconductor packages according to embodiments of the inventive concepts. The processor 714 and the RAM 716 may be encapsulated in a single package. The user interface 718 may be used to input data from an external device into the electric system 700 or output the data of the electronic system 700 to the external device. The memory system 712 may store a code to operate the processor 714, data processed by the processor 714 or data received from an external device. The memory system 712 may include a controller and a memory. The memory system 712 may have substantially the same configuration as the memory card 600 illustrated in FIG. 23. The electronic system 700 may also be applied to an electronic control system of the various electronic products.

FIG. 25 is a schematic view illustrating a mobile phone 800 to which the electronic system 700 of FIG. 24 can be applied. However, it will be understood that, in other embodiments, the electronic system 700 of FIG. 24 may be applied to portable notebook computers, MP3 players, navigators, solid state disks (SSDs), automobiles, and/or household appliances.

According to embodiments of inventive concepts discussed above, a semiconductor device may include at least one through silicon via (TSV) electrode having a pipe-shaped structure that penetrates a substrate and a buffer portion disposed in an isolated substrate portion surrounded by the TSV electrode. Thus, the buffer portion may alleviate thermal stress of the TSV electrode to reduce the keep-out zone between semiconductor elements formed in the outside region of the TSV electrode and the TSV electrode. Further, the buffer portion may reduce, suppress, and/or prevent cracks in the substrate. Accordingly, a semiconductor device having increased reliability may be provided.

While inventive concepts have been described with reference to example embodiments, it will be apparent to those skilled in the art that various changes and modifications may be made without departing from the spirit and scope of inventive concepts.

Therefore, it should be understood that the above embodiments are not limiting, but illustrative. Thus, the scope of inventive concepts is to be determined by the broadest permissible interpretation of the following claims and their equivalents, and shall not be restricted or limited by the foregoing description.

What is claimed is:

1. A semiconductor device comprising:
   a substrate;
   a buffer portion in the substrate, wherein the buffer portion includes at least one of an air gap and/or a seam;
   a conductive through via electrode surrounding the buffer portion and penetrating the substrate to be spaced apart from the buffer portion;
   an isolated substrate portion being a portion of the substrate between the buffer portion and the conductive through via electrode, wherein the conductive through via electrode surrounds the isolated substrate portion and the buffer portion;
   a buffer insulation layer that is disposed between the buffer portion and the isolated substrate portion to define the buffer portion;
   an insulation liner between the conductive through via electrode and the substrate; and
   a diffusion barrier layer between the conductive through via electrode and the substrate,
   wherein the buffer insulation layer includes a same material as the insulation liner.

2. The semiconductor device of claim 1, wherein a depth of the buffer portion into the isolated substrate portion is less than a thickness of the isolated substrate portion, wherein the buffer portion extends to a first surface of the isolated substrate portion and wherein a portion of the isolated substrate portion is between the buffer portion and a second surface of the isolated substrate portion.

3. The semiconductor device of claim 1, wherein the buffer insulated layer extends through an entire thickness of the isolated substrate portion.

4. The semiconductor device of claim 1, wherein the buffer portion includes a first buffer portion and at least one second buffer portion surrounding the first buffer portion.

5. The semiconductor device of claim 1, wherein the buffer portion is disposed in an inner hole and/or an inner trench formed in the isolated substrate portion, wherein the conductive through via electrode is disposed in an outer trench surrounding the inner hole and/or the inner trench, and wherein a width of the inner hole and/or a width of the inner trench is less than a width of the outer trench.

6. The semiconductor device of claim 1, wherein the isolated substrate portion includes a same material as the substrate.

7. A semiconductor device comprising:
   a semiconductor substrate;
   a conductive through via electrode extending through a thickness of the semiconductor substrate, wherein the conductive through via electrode surrounds an inner portion of the semiconductor substrate;
   a buffer in the inner portion of the semiconductor substrate, wherein the conductive through via electrode surrounds and is spaced apart from the buffer, wherein the buffer includes an electrically insulating material within the inner portion of the semiconductor substrate;
   an insulation liner between the conductive through via electrode and the inner portion of the semiconductor substrate; and
   a diffusion barrier layer between the conductive through via electrode and the semiconductor substrate,
   wherein the electrically insulating material of the buffer includes a same material as the insulation liner.

8. The semiconductor device of claim 7, wherein the buffer includes a hole and/or a trench within the inner portion of the semiconductor substrate.

9. The semiconductor device of claim 7, wherein the buffer defines a gap within the inner portion of the semiconductor substrate.

10. A semiconductor device comprising:
    a semiconductor substrate;
    a conductive through via electrode extending through a thickness of the semiconductor substrate, wherein the conductive through via electrode surrounds an inner portion of the semiconductor substrate; and
    a buffer in the inner portion of the semiconductor substrate, wherein the conductive through via electrode surrounds and is spaced apart from the buffer, wherein a depth of the buffer into the inner portion of the semiconductor substrate is less than a thickness of the semiconductor substrate;
    a buffer insulation layer disposed between the buffer and the inner portion of the semiconductor substrate to define the buffer;
    an insulation liner between the conductive through via electrode and the substrate; and
    a diffusion barrier layer between the conductive through via electrode and the substrate,
    wherein the inner portion of the semiconductor substrate includes first and second surfaces on opposite sides thereof, wherein the buffer extends to the first surface of the inner portion of the semiconductor substrate, and wherein a portion of the inner portion of the semiconductor substrate is between the buffer and the second surface of the inner portion of the semiconductor substrate,
    wherein a surface of the buffer insulation layer is coplanar with a surface of the conductive through via electrode.

11. The semiconductor device of claim 10, wherein the buffer includes an electrically insulating material within the inner portion of the semiconductor substrate.

12. The semiconductor device of claim 1 wherein the conductive through via electrode separates the isolated substrate portion from an outer substrate portion.

13. The semiconductor device of claim 12 further comprising:
    a transistor on the outer substrate portion, wherein the transistor is spaced apart from the isolated substrate portion.

14. The semiconductor device of claim 7 wherein the conductive through via electrode separates the inner portion of the semiconductor substrate from an outer portion of the semiconductor substrate.

15. The semiconductor device of claim 14 further comprising:
    a transistor on the outer portion of the semiconductor substrate, wherein the transistor is spaced apart from the inner portion of the semiconductor substrate.

16. The semiconductor device of claim 1 wherein the diffusion barrier comprises at least one of a metal layer, a metal nitride layer, and/or a metal boride layer, and wherein the insulation liner comprises at least one of a silicon oxide layer and/or a silicon nitride layer.

17. The semiconductor device of claim 1 wherein the buffer insulation layer comprises at least one of silicon oxide and/or silicon nitride.

18. The semiconductor device of claim 1, wherein a surface of the buffer insulation layer is coplanar with a surface of the conductive through via electrode.

19. The semiconductor device of claim 1, wherein the buffer portion is disposed in an inner trench, wherein the conductive through via electrode is disposed in an outer trench, wherein a width of the inner trench is narrower than a width of the outer trench, wherein the width of the outer trench is defined as a distance between an inner surface and an outer surface of the outer trench, and wherein the inner surface of the outer trench faces the isolated substrate portion.

* * * * *